(12) United States Patent
An et al.

(10) Patent No.: US 12,114,543 B2
(45) Date of Patent: Oct. 8, 2024

(54) DISPLAY DEVICE WITH ACTIVE PATTERN INTERPOSED BETWEEN ISLAND SHAPED ELECTRODES

(71) Applicant: Samsung Display Co., Ltd., Yongin-si (KR)

(72) Inventors: Jinsung An, Seongnam-si (KR); Seokje Seong, Seongnam-si (KR); Seongjun Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 622 days.

(21) Appl. No.: 17/342,262

(22) Filed: Jun. 8, 2021

(65) Prior Publication Data
US 2022/0392988 A1    Dec. 8, 2022

(51) Int. Cl.
*H10K 59/131*    (2023.01)
*H10K 59/121*    (2023.01)

(52) U.S. Cl.
CPC .......... *H10K 59/131* (2023.02); *H10K 59/121* (2023.02)

(58) Field of Classification Search
CPC ........................... H10K 59/131; H10K 59/121
See application file for complete search history.

(56) References Cited

U.S. PATENT DOCUMENTS

| | | | |
|---|---|---|---|
| 8,711,138 B2 | 4/2014 | Kawabe | |
| 2006/0050191 A1* | 3/2006 | Park | H01L 27/1288 257/E27.113 |
| 2020/0185489 A1* | 6/2020 | Jo | H10K 59/1315 |

* cited by examiner

*Primary Examiner* — Lex H Malsawma
(74) *Attorney, Agent, or Firm* — Lewis Roca Rothgerber Christie LLP

(57) ABSTRACT

A display device includes: a substrate; a first active pattern on the substrate; a second active pattern on the first active pattern; a first upper electrode on the second active pattern and having an island shape; and a first signal line on the first upper electrode, being electrically connected to the first upper electrode, and having an electrical resistance smaller than an electrical resistance of the first upper electrode.

20 Claims, 24 Drawing Sheets

DISPLAY DEVICE WITH ACTIVE PATTERN INTERPOSED BETWEEN ISLAND SHAPED ELECTRODES

BACKGROUND

1. Field

Aspects of some embodiments of the present invention relate generally to a display device.

2. Discussion of the Background

In general, display devices include a plurality of pixel structures. A pixel structure generally includes one or more transistors, at least one storage capacitor, and a light emitting diode. The transistors are formed of a plurality of electrodes and a plurality of lines, and various signals and voltages are provided to the electrodes and the lines. The light emitting diode may emit light according to the signals and the voltages. Meanwhile, as display devices increase in size, the lengths of the lines correspondingly increase, and the electrical resistance of the lines increases. Accordingly, the transmission speed of the signals and the voltages provided through the lines may be reduced accordingly, and the voltage level may also be changed, so that the display quality of the display device may deteriorate.

The above information disclosed in this Background section is only for enhancement of understanding of the background and therefore the information discussed in this Background section does not necessarily constitute prior art.

SUMMARY

Aspects of some embodiments of the present invention relate generally to a display device. For example, some embodiments of the invention relate generally to a display device including a signal line.

Aspects of some embodiments include a display device with relatively improved display quality.

A display device according to some embodiments may include a substrate, a first active pattern on the substrate, a second active pattern on the first active pattern, a first upper electrode on the second active pattern and having an island shape, and a first signal line on the first upper electrode, being electrically connected to the first upper electrode, and having an electrical resistance smaller than an electrical resistance of the first upper electrode.

According to some embodiments, the display device may further include a first lower electrode between the first active pattern and the second active pattern, and having an island shape. The first signal line may be electrically connected to the first lower electrode.

According to some embodiments, the first signal line may contact the first lower electrode and the first upper electrode.

According to some embodiments, the first lower electrode, the first upper electrode, and the second active pattern may overlap each other.

According to some embodiments, the display device may further include a second upper electrode on the second active pattern and having an island shape, and a second signal line on the second upper electrode and being electrically connected to the second upper electrode.

According to some embodiments, the display device may further include a second lower electrode between the first active pattern and the second active pattern, and having an island shape. The second signal line may be electrically connected to the second lower electrode.

According to some embodiments, the second signal line may contact the second lower electrode and the second upper electrode.

According to some embodiments, the second lower electrode, the second upper electrode, and the second active pattern may overlap each other.

According to some embodiments, the display device may further include a first gate electrode between the first active pattern and the second active pattern and having an island shape, and a third signal line on the first gate electrode and being electrically connected to the first gate electrode.

According to some embodiments, the third signal line may contact the first gate electrode, and the first active pattern, the first gate electrode, and the third signal line may overlap each other.

According to some embodiments, the display device may further include a second gate electrode between the first active pattern and the second active pattern, and having an island shape, and a fourth signal line on the second gate electrode and being electrically connected to the second gate electrode.

According to some embodiments, the fourth signal line may contact the second gate electrode, and the first active pattern, the second gate electrode, and the fourth signal line may overlap each other.

According to some embodiments, the first signal line may contact the first upper electrode.

According to some embodiments, the first upper electrode may contact the first lower electrode.

According to some embodiments, the first signal line may contact the first lower electrode.

According to some embodiments, the first lower electrode may contact the first upper electrode.

According to some embodiments, the display device may further include a first lower electrode in a same layer as the first active pattern and having an island shape. The first signal line may be electrically connected to the first lower electrode.

According to some embodiments, the first signal line may contact the first lower electrode and the first upper electrode.

According to some embodiments, the first upper electrode and the first signal line may include metal materials different from each other.

According to some embodiments, the first active pattern may include polycrystalline silicon, and the second active pattern may include an oxide semiconductor.

Therefore, a display device according to some embodiments of present invention may include an upper electrode on an active pattern, a lower electrode below the active pattern, and a signal line electrically connected to the upper electrode and the lower electrode. By transmitting the gate signal through a signal line having the electrical resistance smaller than the electrical resistance of the upper electrode, the transmission speed of the gate signal may be improved, and the voltage level of the gate signal may be maintained. In addition, as the active pattern, the upper electrode, and the lower electrode overlap each other, the transistor may be implemented in a dual-gate structure, so that the turn-on characteristic and/or the turn-off characteristic of the transistor may be improved.

It is to be understood that both the foregoing general description and the following detailed description are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Illustrative, non-limiting embodiments will be more clearly understood from the following detailed description in conjunction with the accompanying drawings.

Figure 1:
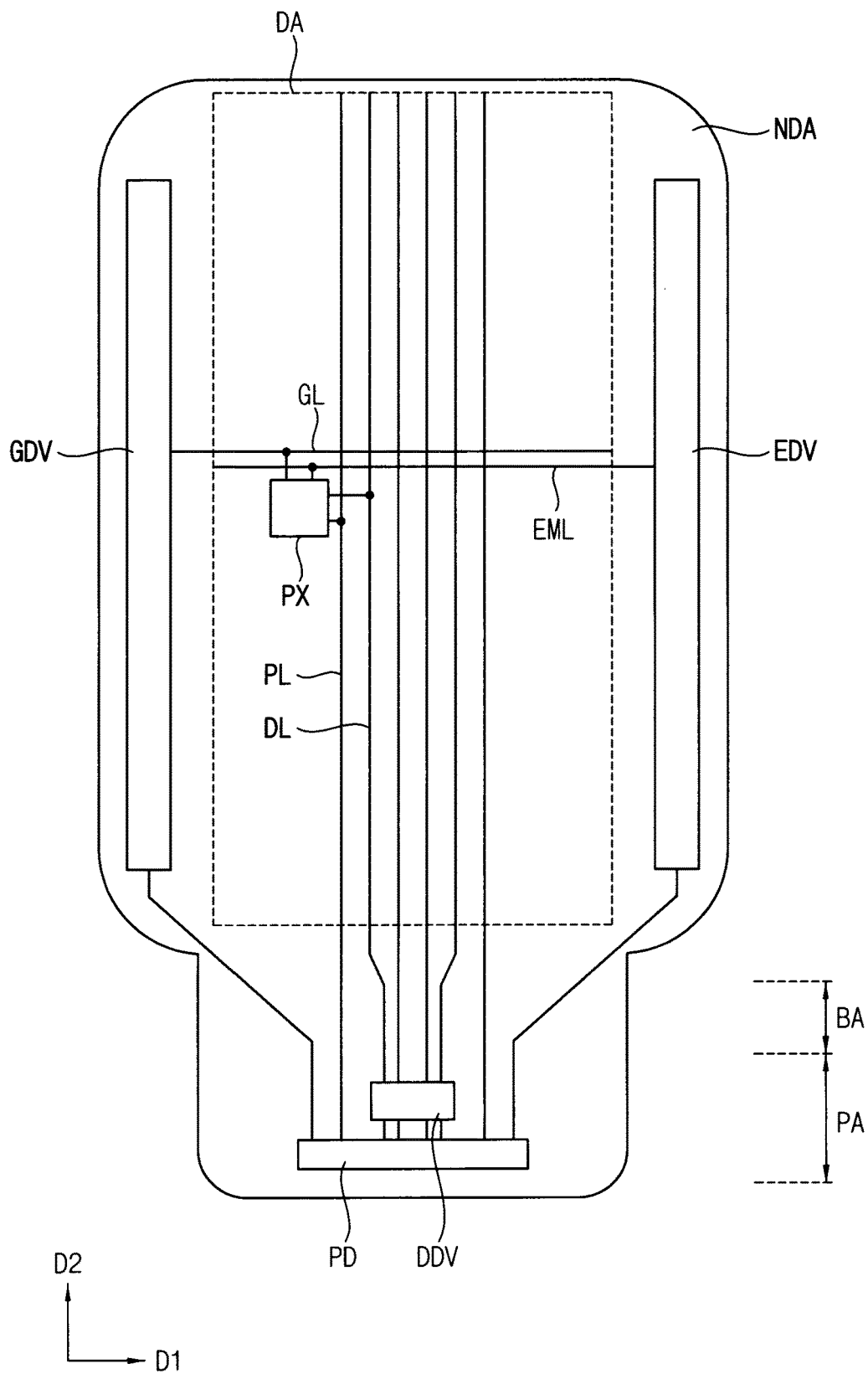
FIG. 1 is a plan view illustrating a display device according to some embodiments.
Figure 2:
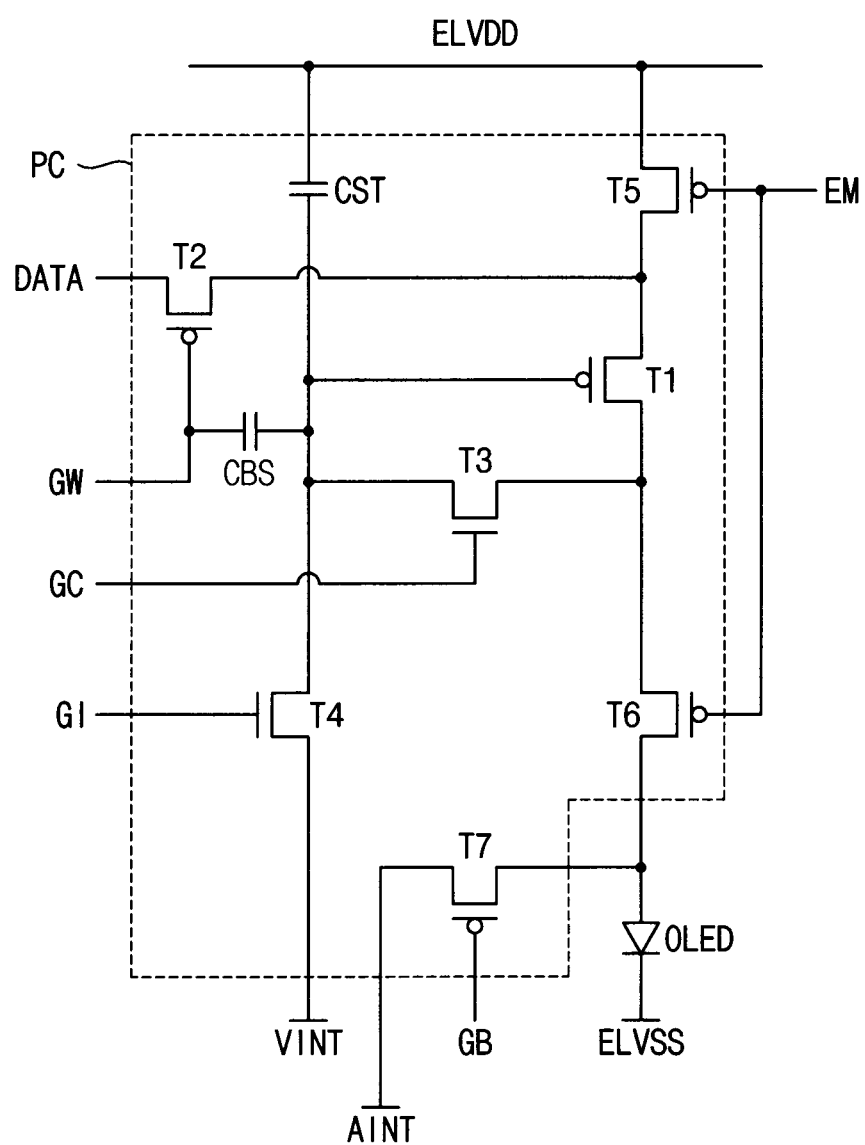
FIG. 2 is a circuit diagram illustrating a pixel circuit and an organic light emitting diode included in the display device of FIG. 1 according to some embodiments.

FIG. 1 is a plan view illustrating a display device according to embodiments. FIG. 2 is a circuit diagram illustrating a pixel circuit and an organic light emitting diode included in the display device of FIG. 1.

Referring to FIGS. 1 and 2, the display device 10 may include a display area DA, a non-display area NDA surrounding the display area DA, a bending area BA configured to be bent, and a pad area PA.

For example, a pixel structure PX may be located in the display area DA, and a driver for driving the pixel structure PX may be located in the non-display area NDA. For example, a pad part PD and a data driver DDV may be located in the pad area PA, and the bending area BA may be bent based on a virtual bending axis.

The pixel structure PX and a data line DL, a gate line GL, an emission control line EML, and a driving voltage line PL, which are connected to the pixel structure PX may be located in the display area DA.

The data line DL may be electrically connected to the data driver DDV and may extend along a second direction D2. The data line DL may receive a data voltage DATA from the data driver DDV and may provide the data voltage DATA to a pixel circuit PC.

The gate line GL may be electrically connected to a gate driver GDV and may extend along a first direction D1 crossing the second direction D2. The gate line GL may receive a gate signal from the gate driver GDV and may provide the gate signal to the pixel circuit PC.

The emission control line EML may be connected to an emission driver EDV and may extend along the first direction D1. The emission control line EML may receive an emission control signal EM from the emission driver EDV and may provide the emission control signal EM to the pixel circuit PC. For example, an activation period of the emission control signal EM may be an emission period of the display device 10, and an inactivation period of the emission control signal EM may be a non-emission period of the display device 10.

The driving voltage line PL may be connected to the pad part PD and may extend along the second direction D2. The driving voltage line PL may receive a high power voltage ELVDD from the pad part PD and may provide the high power voltage ELVDD to the pixel circuit PC. Meanwhile, a lower power voltage ELVSS may be commonly provided to an opposite electrode (e.g., a cathode electrode) of an organic light emitting diode OLED.

The driver may include the gate driver GDV, the data driver DDV, the emission driver EDV, and the pad part PD. In addition, the driver may include a timing controller, and the timing controller may control the gate driver GDV, the data driver DDV, the emission driver EDV, and the pad part PD.

The gate driver GDV may receive a voltage from the pad part PD to generate the gate signal. For example, the gate signal may include a first gate signal GW, a second gate signal GC, a third gate signal GI, and a fourth gate signal GB.

The data driver DDV may generate the data voltage DATA corresponding to the emission period and the non-emission period. The emission driver EDV may receive a voltage from the pad part PD to generate the emission control signal EM. The pad part PD may be electrically connected to an external device to provide voltages to the gate driver GDV, the emission driver EDV, and the driving voltage line PL, respectively.

The gate driver GDV and the emission driver EDV are respectively located on the left and right sides of the display device 10 in FIG. 1, but embodiments according to the present disclosure are not limited thereto.

In addition, the data driver DDV is mounted in the non-display area NDA of the display device 10 in FIG. 1, but the present invention is not limited thereto. For example, the data driver DDV may be located on a flexible printed circuit board, and the pad part PD may be electrically connected to the flexible printed circuit board. Additionally, according to some embodiments, the data driver DDV, the gate driver GDV, and the emission driver EDV may be located at different edges or locations relative to the display area DA, according to the design and application of the display device.

As illustrated in FIG. 2, the pixel circuit PC may include a first transistor T1, a second transistor T2, a third transistor T3, a fourth transistor T4, a fifth transistor T5, a sixth transistor T6, a seventh transistor T7, a storage capacitor CST, and a boosting capacitor CBS. The pixel circuit PC may be electrically connected to the organic light emitting diode OLED to provide a driving current to the organic light emitting diode OLED.

The organic light emitting diode OLED may include a first terminal (e.g., an anode terminal) and a second terminal (e.g., a cathode terminal), the first terminal of the organic light emitting diode OLED may be connected to the first transistor T1 through the sixth transistor T6 to receive the driving current, and the second terminal may receive the lower power voltage ELVSS. The organic light emitting diode OLED may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive the high power voltage ELVDD. The storage capacitor CST may maintain a voltage level of a gate terminal of the first transistor T1 during an inactive period of the first gate signal GW.

The boosting capacitor CBS may include a first terminal and a second terminal. The first terminal of the boosting capacitor CBS may be connected to the first terminal of the storage capacitor CST, and the second terminal of the boosting capacitor CBS may receive the first gate signal GW. The boosting capacitor CBS may compensate for a voltage drop of the gate terminal of the first transistor T1 by increasing a voltage of the gate terminal of the first transistor T1 when a provision of the first gate signal GW is stopped.

The first transistor T1 may include a gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 to receive the data voltage DATA. The second terminal of the first transistor T1 may be connected to the organic light emitting diode OLED through the sixth transistor T6 to provide the driving current. The first transistor T1 may generate the driving current based on a voltage difference between the gate terminal and the first terminal. For example, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or off in response to the first gate signal GW. For example, when the second transistor T2 is a PMOS transistor, the second transistor T2 may be turned off when the first gate signal GW has a positive voltage level, and may be turned on when the first gate signal GW has a negative voltage level. The first terminal of the second transistor T2 may receive the data voltage DATA through the data line DL. The second terminal of the second transistor T2 may provide the data voltage DATA to the first terminal of the first transistor T1 while the second transistor T2 is turned on. For example, the second transistor T2 may be referred to as a switching transistor.

The third transistor T3 may include a gate terminal, a first terminal (e.g., a source terminal), and a second terminal (e.g., a drain terminal). The gate terminal of the third transistor T3 may receive the second gate signal GC. The first terminal of the third transistor T3 may be connected to the gate terminal of the first transistor T1. The second terminal of the third transistor T3 may be connected to the second terminal of the first transistor T1.

The third transistor T3 may be turned on or off in response to the second gate signal GC. For example, when the third transistor T3 is an NMOS transistor, the third transistor T3 may be turned on when the second gate signal GC has a positive voltage level, and may be turned off when the second gate signal GC has a negative voltage level.

During a period in which the third transistor T3 is turned on in response to the second gate signal GC, the third transistor T3 may diode-connect the first transistor T1. Because the first transistor T1 is diode-connected, a voltage difference equal to a threshold voltage of the first transistor T1 between the gate terminal of the first transistor T1 and the first terminal of the first transistor T1 may occur. Accordingly, a summed voltage of the data voltage DATA provided to the first terminal of the first transistor T1 during a period in which the third transistor T3 is turned on and the voltage difference may be provided to the gate terminal of the first transistor T1. Accordingly, the third transistor T3 may compensate for the threshold voltage of the first transistor T1. For example, the third transistor T3 may be referred to as a compensation transistor.

The fourth transistor T4 may include a gate terminal, a first terminal (e.g., a source terminal), and a second terminal (e.g., a drain terminal). The gate terminal of the fourth transistor T4 may receive the third gate signal GI. The first terminal of the fourth transistor T4 may receive a gate initialization voltage VINT. The second terminal of the fourth transistor T4 may be connected to the gate terminal of the first transistor T1.

The fourth transistor T4 may be turned on or off in response to the third gate signal GI. For example, when the fourth transistor T4 is an NMOS transistor, the fourth transistor T4 may be turned on when the third gate signal GI has a positive voltage level, and may be turned off when the third gate signal GI has a negative voltage level.

During a period in which the fourth transistor T4 is turned on to the third gate signal GI, the gate initialization voltage VINT may be provided to the gate terminal of the first transistor T1. Accordingly, the fourth transistor T4 may initialize the gate terminal of the first transistor T1 to the gate initialization voltage VINT. For example, the fourth transistor T4 may be referred to as a gate initialization transistor.

The fifth transistor T5 may include a gate terminal, a first terminal (e.g., a source terminal), and a second terminal (e.g., a drain terminal). The gate terminal of the fifth transistor T5 may receive the emission control signal EM. The first terminal of the fifth transistor T5 may receive the high power voltage ELVDD. The second terminal of the fifth transistor T5 may be connected to the first terminal of the first transistor T1. When the fifth transistor T5 is turned on in response to the emission control signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the second terminal of the first transistor T1. The second terminal of the sixth transistor T6 may be connected to the first terminal of the organic light emitting diode OLED. When the sixth transistor T6 is turned on in response to the emission control signal EM, the sixth transistor T6 may provide the driving current generated by the first transistor T1 to the organic light emitting diode OLED.

The seventh transistor T7 may include a gate terminal, a first terminal (e.g., a source terminal), and a second terminal (e.g., a drain terminal). The gate terminal of the seventh transistor T7 may receive the fourth gate signal GB. The first terminal of the seventh transistor T7 may receive an anode initialization voltage AINT. The second terminal of the seventh transistor T7 may be connected to the first terminal of the organic light emitting diode OLED. When the seventh transistor T7 is turned on in response to the fourth gate signal GB, the seventh transistor T7 may provide the anode initialization voltage AINT to the organic light emitting diode OLED. Accordingly, the seventh transistor T7 may initialize the first terminal of the organic light emitting diode OLED to the anode initialization voltage AINT. For example, the seventh transistor T7 may be referred to as an anode initialization transistor.

Meanwhile, an example connection structure of the pixel circuit PC is shown in FIG. 2, but embodiments according to the present disclosure are not limited thereto. For example, according to some embodiments, the pixel circuit PC may include additional components, or fewer components, without departing from the spirit and scope of embodiments according to the present disclosure. For example, when the pixel circuit PC does not include the third to seventh transistors T3, T4, T5, T6, and T7, and the boosting capacitor CBS, a connection structure between the components (i.e., a first transistor T1, a second transistor T2, and a storage capacitor CST) in the pixel circuit PC may be changed to connect the organic light emitting diode OLED.

FIGS. 3 to 9 are layout diagrams illustrating a pixel structure included in the display device of FIG. 1 according to some embodiments.

Figure 3:
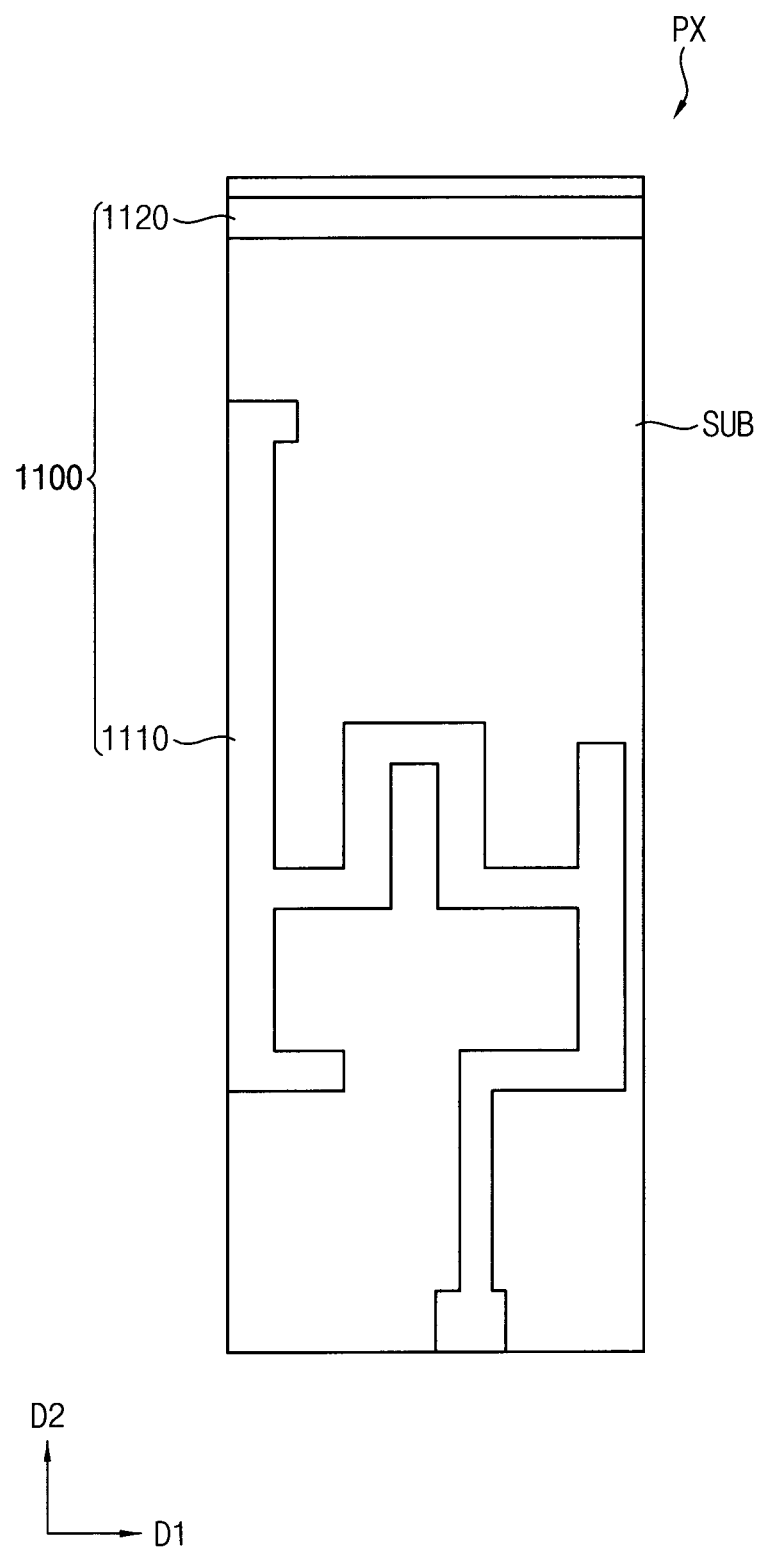
FIGS. 3 to 9 are layout diagrams illustrating a pixel structure included in the display device of FIG. 1 according to some embodiments.

Referring to FIG. 3, the pixel structure PX may include a substrate SUB and a first conductive pattern 1100 located on the substrate SUB. The first conductive pattern 1100 may include a first active pattern 1110 and a gate initialization voltage line 1120.

The substrate SUB may include a glass substrate, a quartz substrate, a plastic substrate, or the like. According to some embodiments, the substrate SUB may include a plastic substrate, and accordingly, the display device 10 may have a flexible characteristic. In this case, the substrate SUB may have a structure in which at least one organic film layer and at least one barrier layer are alternately stacked. For example, the organic film layer may be formed using an organic material such as polyimide, and the barrier layer may be formed using an inorganic material.

A buffer layer (e.g., a buffer layer BFR in FIG. 10) may be located on the substrate SUB. The buffer layer may prevent or reduce diffusion of metal atoms or impurities from the substrate SUB into the first conductive pattern 1100. In addition, the buffer layer may uniformly form the first conductive pattern 1100 by controlling a heat supply rate during a crystallization process for forming the first conductive pattern 1100.

The first active pattern 1110 may be located on the buffer layer. According to some embodiments, the first active pattern 1110 may include a silicon semiconductor. For example, the silicon semiconductor may include amorphous silicon, polycrystalline silicon, or the like.

According to some embodiments, ions may be selectively implanted into the first active pattern 1110. For example, when the first, second, fifth, sixth, and seventh transistors T1, T2, T5, T6, and T7 are PMOS transistors, the first active pattern 1110 may include a source region and a drain region to which positive ions are injected, and a channel region to which the positive ions are not injected.

The gate initialization voltage line 1120 may extend along the first direction D1. According to some embodiments, the gate initialization voltage line 1120 may provide the gate initialization voltage VINT to the fourth transistor T4. According to some embodiments, the gate initialization voltage line 1120 may be located on a different layer from a layer in which the first active pattern 1110 is located.

A first gate insulating layer (e.g., a first gate insulating layer Gl1 in FIG. 10) may cover the first conductive pattern 1100 and may be located on the substrate SUB. The first gate insulating layer may include an insulating material. For example, the first gate insulating layer may include silicon oxide, silicon nitride, titanium oxide, tantalum oxide, or the like.

Figure 4:
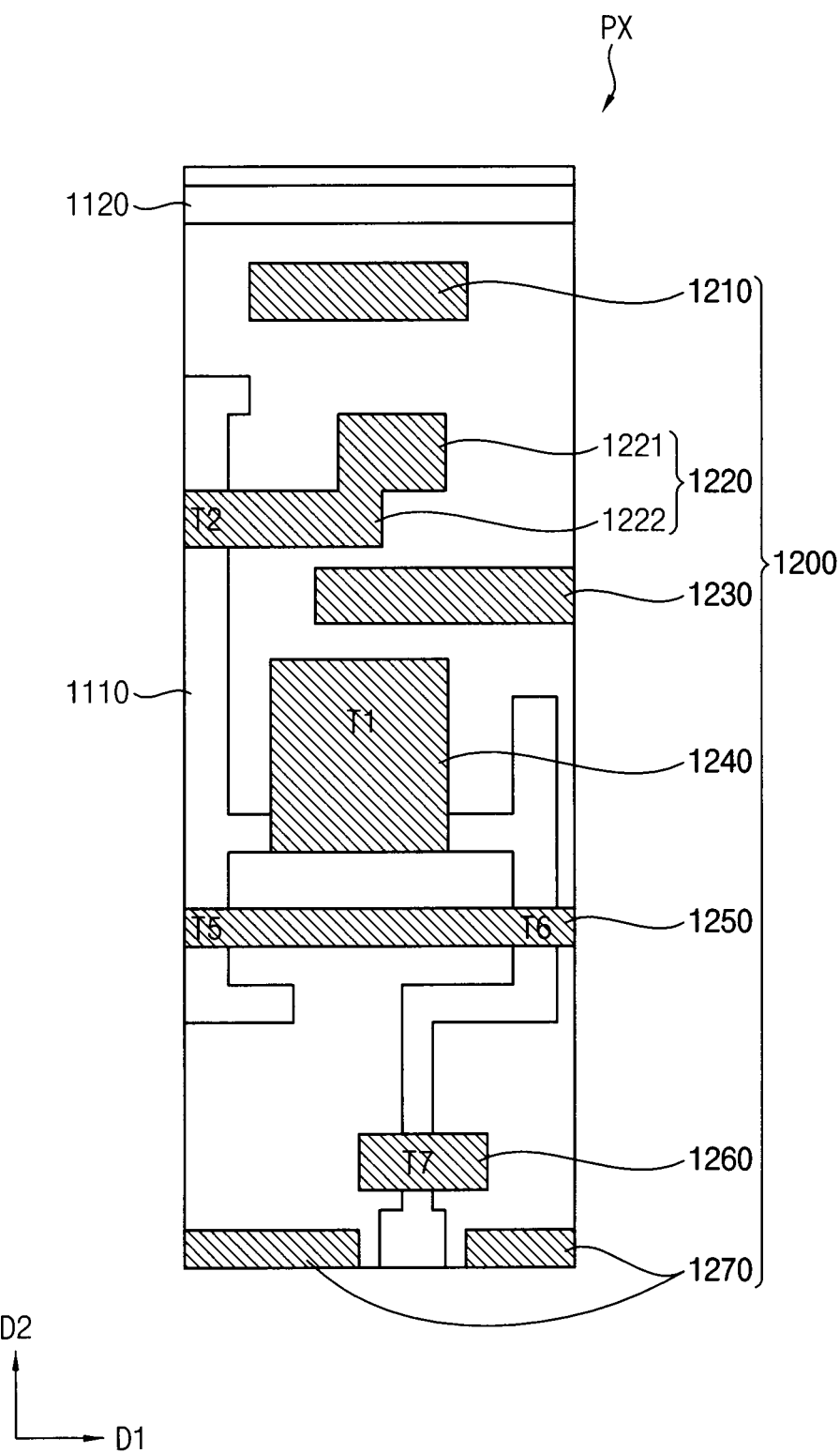

Referring to FIG. 4, a second conductive pattern 1200 may be located on the first gate insulating layer. The second conductive pattern 1200 may include a first lower electrode 1210, a first gate electrode 1220, a second lower electrode 1230, a third gate electrode 1240, an emission control line 1250, a gate electrode 1260, and an anode initialization voltage line 1270. The first gate electrode 1220 may include a first portion 1221 and a second portion 1222 connected to the first portion 1221.

The first lower electrode 1210 may extend along the first direction D1 and may have an island shape. For example, the first lower electrode 1210 may function as a lower gate electrode of the fourth transistor T4. For example, the first lower electrode 1210 may contact a first signal line (e.g., a first signal line 1520 in FIG. 11) to be described later.

The first gate electrode 1220 may have an island shape. For example, the first portion 1221 may function as the second terminal of the boosting capacitor CBS, and the second portion 1222 may constitute the second transistor T2 together with a portion of the first active pattern 1110. For example, the second portion 1222 may be connected to the first portion 1221 to function as the gate terminal of the second transistor T2. For example, the second portion 1222 may contact a third signal line (e.g., a third signal line 1541 in FIG. 12) to be described later.

The second lower electrode 1230 may extend along the first direction D1 and may have an island shape. For example, the second lower electrode 1230 may function as a lower gate electrode of the third transistor T3. For example, the second lower electrode 1230 may contact a second signal line (e.g., a second signal line 1550 in FIG. 10) to be described later.

The third gate electrode 1240 may have an island shape. For example, the third gate electrode 1240 may constitute the first transistor T1 together with a portion of the first active pattern 1110.

The emission control line 1250 may extend along the first direction D1. For example, the emission control line 1250 may constitute the fifth and sixth transistors T5 and T6 together with a portion of the first active pattern 1110. For example, the emission control signal EM may be provided to the emission control line 1250.

The second gate electrode 1260 may have an island shape. For example, the second gate electrode 1260 may constitute the seventh transistor T7 together with a portion of the first active pattern 1110. For example, the second gate electrode 1260 may contact a fourth signal line (e.g., a fourth signal line 1542 in FIG. 13) to be described later.

The anode initialization voltage line 1270 may extend along the first direction D1. According to some embodiments, the anode initialization voltage line 1270 may have gaps or spaces between segments so as to avoid overlapping other components or elements in a plan view. For example, the anode initialization voltage line 1270 may be spaced apart so as not to overlap the first active pattern 1110. The anode initialization voltage line 1270 may provide the anode initialization voltage AINT to the seventh transistor T7.

The structure and shape of the elements of the first conductive pattern 1100 and the second conductive pattern 1200 may vary according to the design and application of the display device, and may have different footprints in a plan view than the illustrated footprints in FIGS. 3 and 4.

According to some embodiments, the second conductive pattern 1200 may include a metal, an alloy, a conductive metal oxide, a transparent conductive material, or the like. For example, the second conductive pattern 1200 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. According to some embodiments, to secure process reliability, the second conductive pattern 1200 may include the molybdenum ("Mo"), an alloy containing molybdenum, or the like.

A first interlayer insulating layer (e.g., a first interlayer insulating layer ILD1 in FIG. 10) may cover the second conductive pattern 1200 and may be located on the first gate insulating layer. The first interlayer insulating layer may include an insulating material.

Meanwhile, the first, second, fifth, sixth, and seventh transistors T1, T2, T5, T6, and T7 may be substantially the same as the transistors T1, T2, T5, T6, and T7 described with reference to FIG. 2. In addition, the gate terminals, the first terminals, and the second terminals described with reference to FIG. 2 may substantially correspond to conductive patterns to be described later. However, this correspondence will not be described in detail, and the correspondence will be apparent to those skilled in the art to which the present invention.

Figure 5:
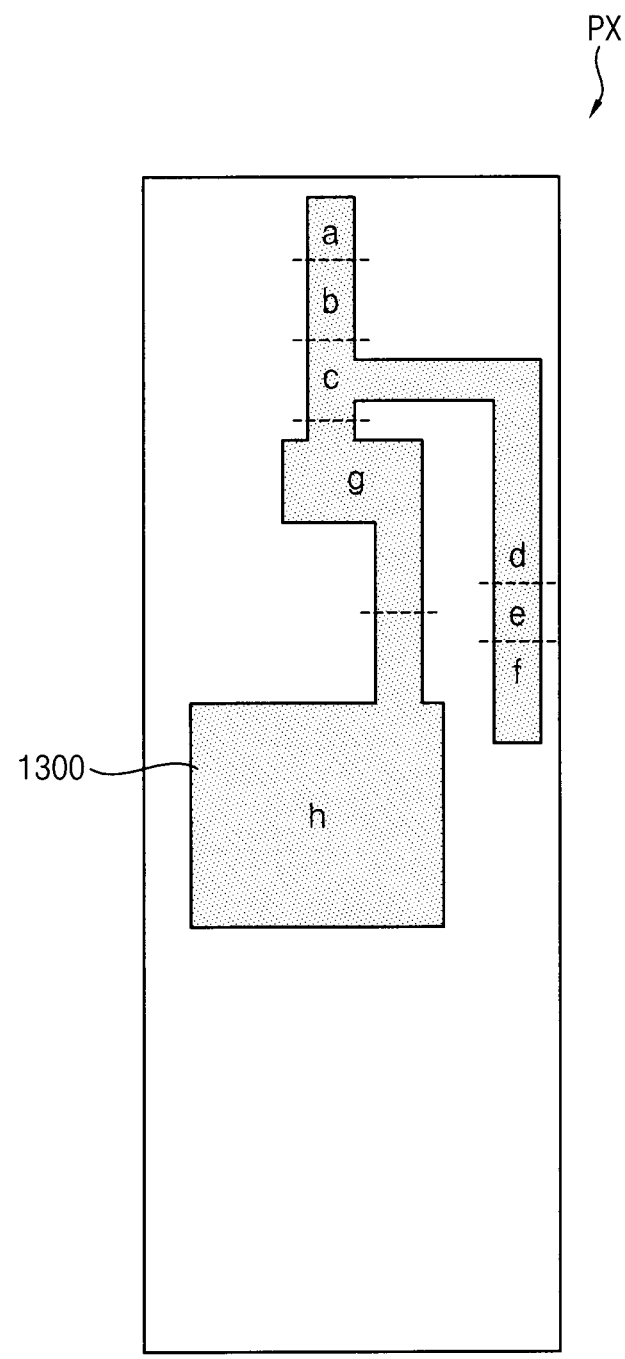
Figure 6:
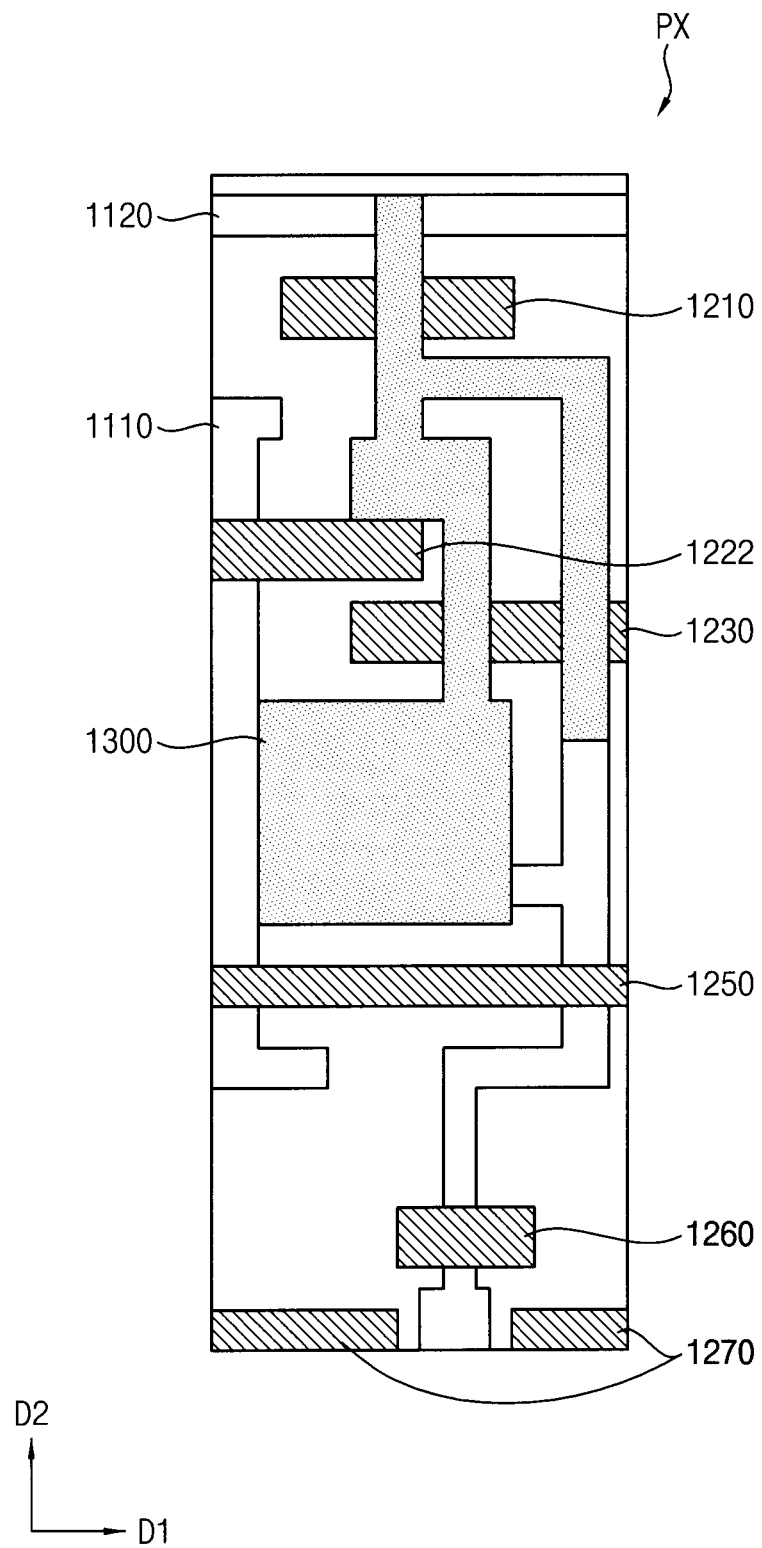

Referring to FIGS. 5 and 6, the second active pattern 1300 may be located on the first interlayer insulating layer. According to some embodiments, the second active pattern 1300 may include an oxide semiconductor.

For example, the second active pattern 1300 may include a channel region, a source region, and a drain region for configuring the third and fourth transistors T3 and T4. For example, the second active pattern 1300 may include a channel region b, a source region a, and a drain region c for configuring the fourth transistor T4. The channel region b may overlap the first lower electrode 1210. In addition, the second active pattern 1300 may include a channel region e, a source region f, and a drain region d for configuring the third transistor T3. The channel region e may overlap the second lower electrode 1230.

In addition, according to some embodiments, the second active pattern 1300 may further include a third portion g that may function as the first terminal of the boosting capacitor CBS. The third portion g may overlap the first portion 1221. In addition, the second active pattern 1300 may include a fourth portion h that may function as the second terminal of the storage capacitor CST. The fourth portion h may overlap the third gate electrode 1240. The fourth part h may contact a high power voltage pattern (e.g., a high power voltage pattern 1570 in FIG. 14) to be described later. Accordingly, the boosting capacitor CBS and the storage capacitor CST may be formed without further including a separate metal layer.

A second gate insulating layer (e.g., a second gate insulating layer GI2 in FIG. 10) may cover the second active pattern 1300 and may be located on the first interlayer insulating layer. The second gate insulating layer may include an insulating material.

Figure 7:
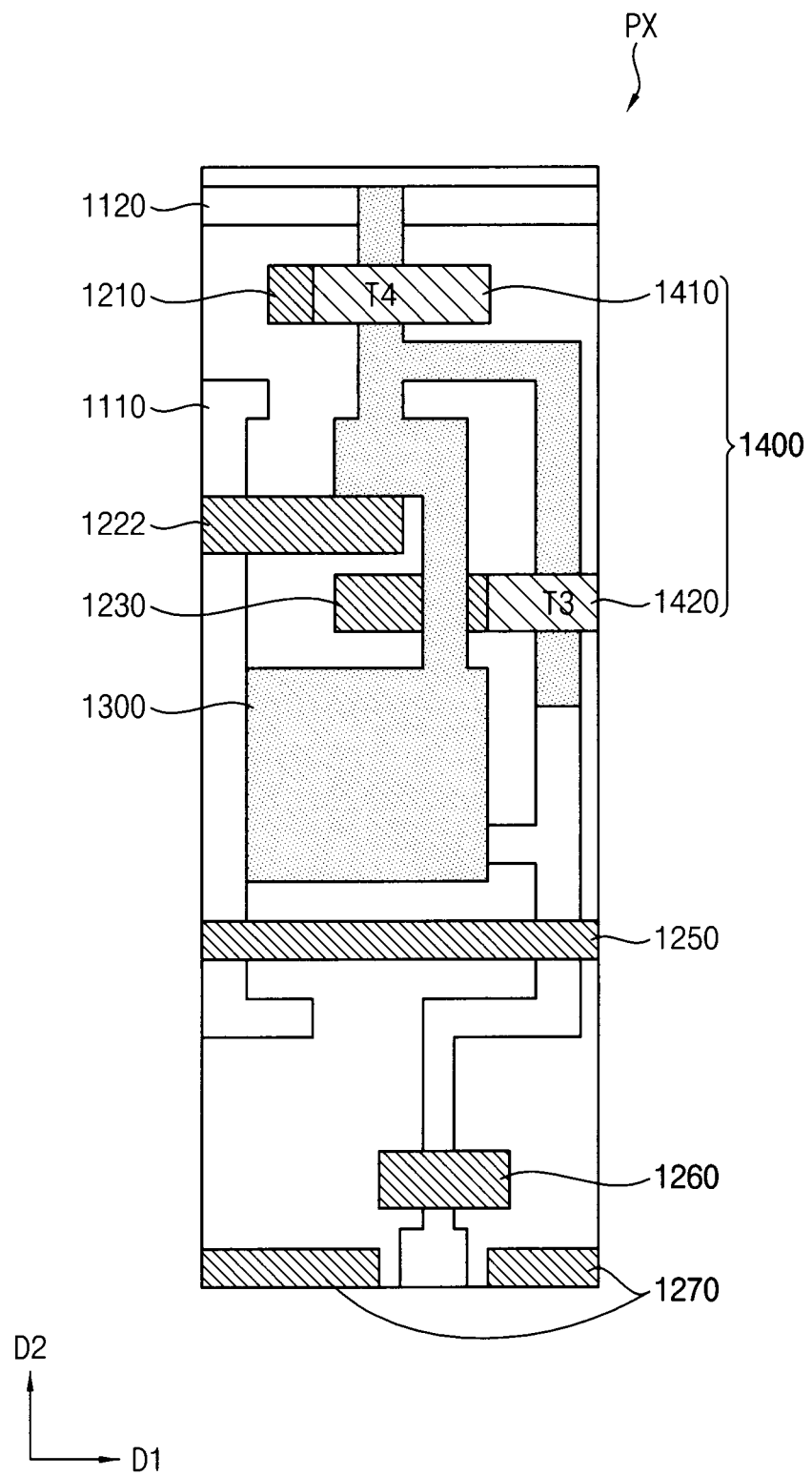

Referring to FIG. 7, a third conductive pattern 1400 may be located on the second gate insulating layer. The third conductive pattern 1400 may include a first upper electrode 1410 and a second upper electrode 1420.

The first upper electrode 1410 may extend along the first direction D1 and may have an island shape. For example, the first upper electrode 1410 may function as an upper gate electrode of the fourth transistor T4. In other words, the fourth transistor T4 may have a dual-gate structure. For example, the first upper electrode 1410 may contact a first signal line (e.g., a first signal line 1520 in FIG. 11) to be described later.

The second upper electrode 1420 extends along the first direction D1 and may have an island shape. For example, the second upper electrode 1420 may function as an upper gate electrode of the third transistor T3. In other words, the third transistor T3 may have a dual-gate structure. For example, the second upper electrode 1420 may contact a second signal line (e.g., a second signal line 1550 in FIG. 10) to be described later.

Because each of the third and fourth transistors T3 and T4 has a dual-gate structure, turn-on characteristics and/or turn-off characteristics of the third and fourth transistors T3 and T4 may be improved.

For example, the third conductive pattern 1400 may include a metal, an alloy, a conductive metal oxide, a transparent conductive material, and the like. For example, the third conductive pattern 1400 may include the same material as the second conductive pattern 1200. According to some embodiments, the second and third conductive patterns 1200 and 1400 may include the molybdenum ("Mo"), an alloy containing molybdenum, or the like to secure process reliability.

A second interlayer insulating layer (e.g., a second interlayer insulating layer ILD2 in FIG. 10) may cover the third conductive pattern 1400 and may be located on the second gate insulating layer. The second interlayer insulating layer may include an insulating material.

Figure 8:
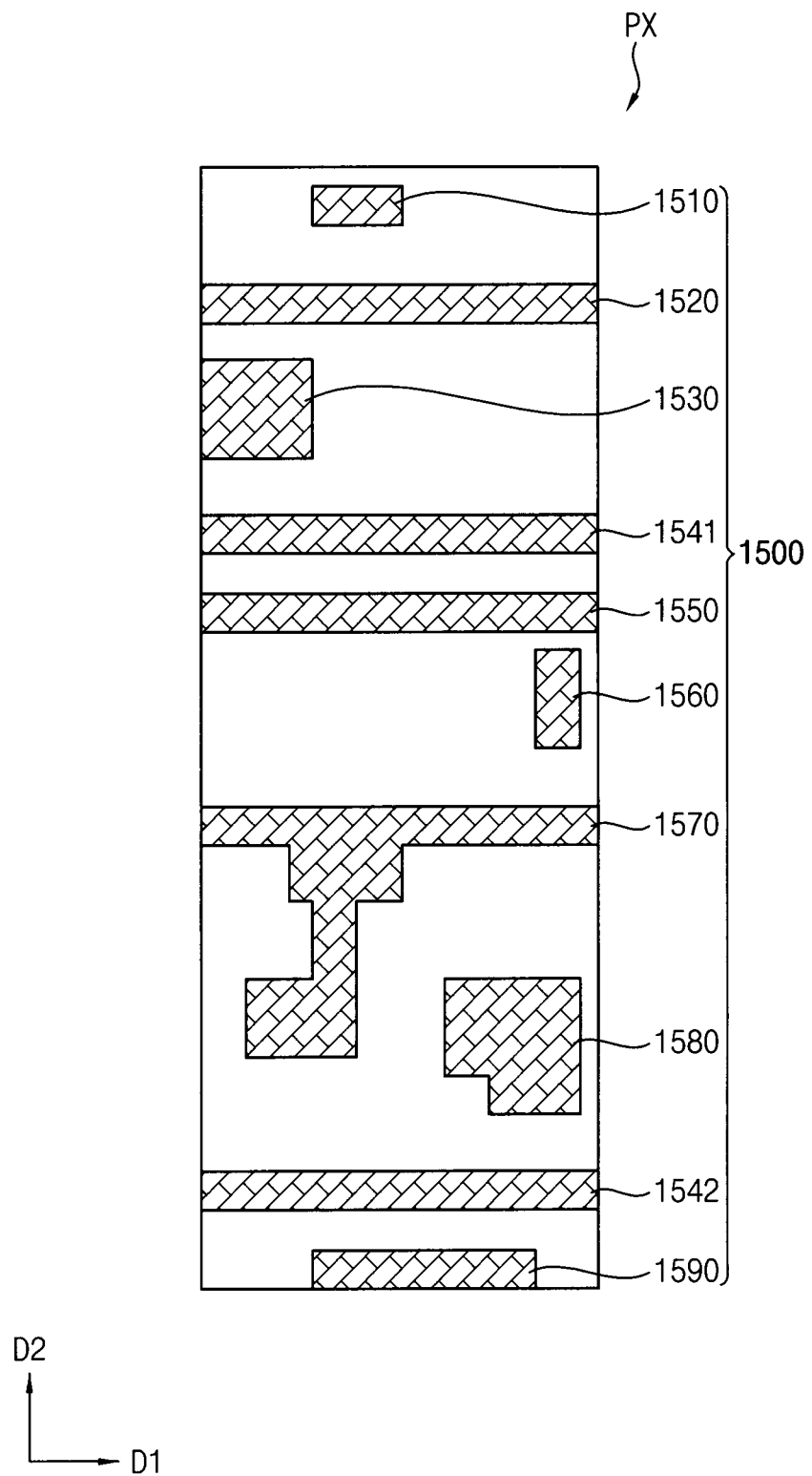
Figure 9:
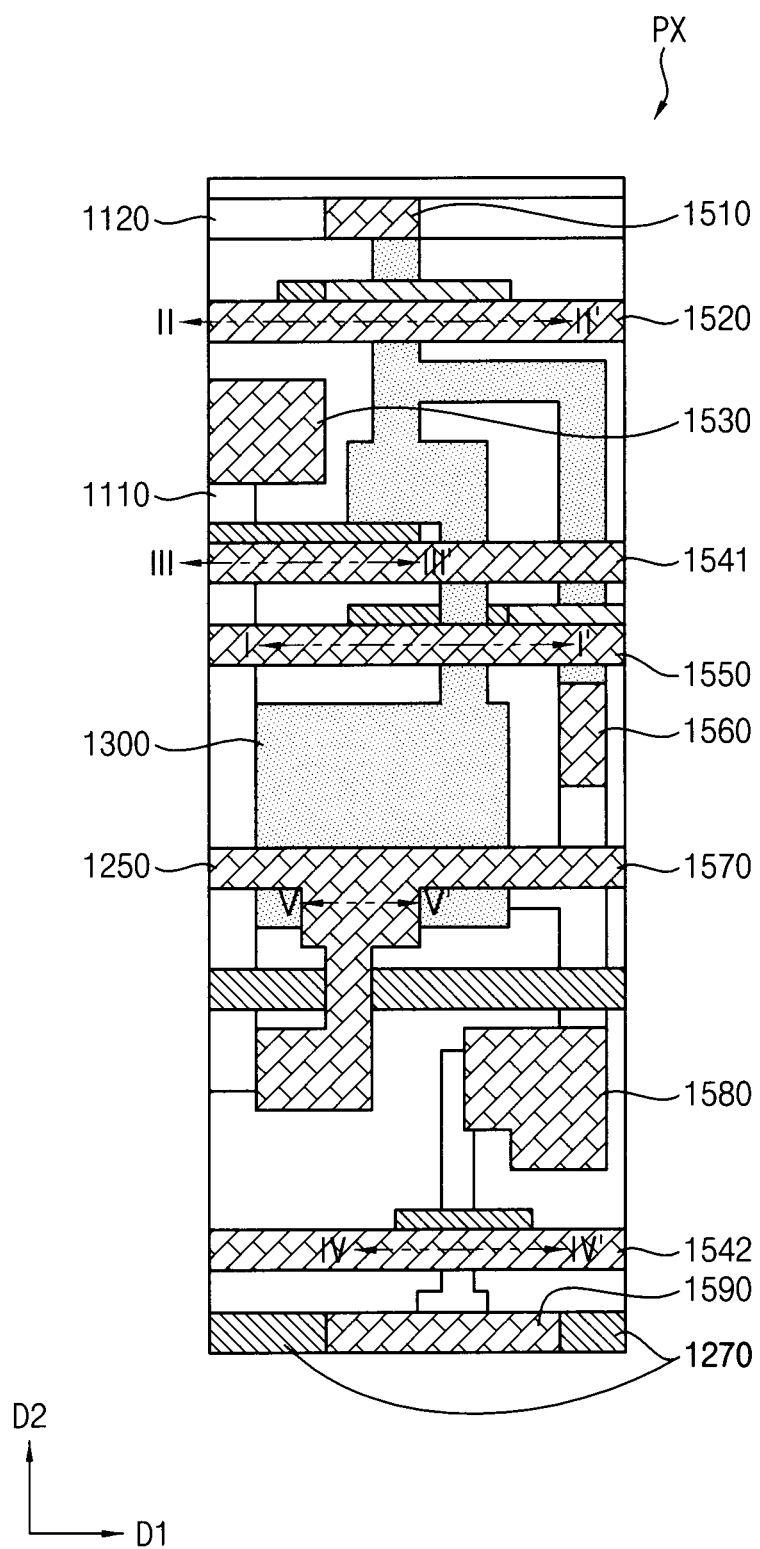

Referring to FIGS. 8 and 9, the fourth conductive pattern 1500 may include a gate initialization voltage connection line 1510, a first signal line 1520, a first pad 1530, a third signal line 1541, a second signal line 1550, a compensation connection pattern 1560, a high power voltage pattern 1570, a second pad 1580, a fourth signal line 1542, and an anode initialization voltage connection line 1590.

The gate initialization voltage connection line 1510 may electrically connect the gate initialization voltage line 1120 and the second active pattern 1300. The gate initialization voltage VINT may be transmitted to the first active pattern 1110 through the gate initialization voltage connection line 1510.

The first signal line 1520 may extend along the first direction D1. For example, the third gate signal GI may be provided to the first signal line 1520. According to some embodiments, the first signal line 1520 may contact the first lower electrode 1210 and the first upper electrode 1410. Accordingly, the third gate signal GI provided through the first signal line 1520 may be transmitted to the first lower electrode 1210 and the first upper electrode 1410.

The first pad 1530 may transmit the data voltage DATA to the first active pattern 1110. For example, the first pad 1530 may be located between the first active pattern 1110 and a data line, and may contact the first active pattern 1110 and the data line.

The third signal line 1541 may extend along the first direction D1. For example, the first gate signal GW may be provided to the third signal line 1541. According to some embodiments, the third signal line 1541 may contact the second portion 1222 of the first gate electrode 1220. Accordingly, the first gate signal GW provided through the third signal line 1541 may be transmitted to the second portion 1222.

The second signal line 1550 may extend along the first direction D1. For example, the second gate signal GC may be provided to the second signal line 1550. According to some embodiments, the second signal line 1550 may contact the second lower electrode 1230 and the second upper electrode 1420. Accordingly, the second gate signal GC may be transmitted to the second lower electrode 1230 and the second upper electrode 1420.

The compensation connection pattern 1560 may electrically connect the second active pattern 1300 and the first active pattern 1110. For example, the second terminal (e.g., the drain terminal of the third transistor) of the third transistor T3 may be connected to the second terminal (e.g., the drain terminal of the first transistor T1) of the first transistor T1 through the compensation connection pattern 1560.

The high power voltage pattern 1570 may transmit the high power voltage ELVDD to the second active pattern 1300 and the first active pattern 1110. For example, the high power voltage pattern 1570 may contact the second active pattern 1300 in a partial region i overlapping the second active pattern 1300. In addition, the high power voltage pattern 1570 may contact the first active pattern 1110 in another partial region j overlapping the first active pattern 1110.

The second pad 1580 may provide the driving current and the anode initialization voltage AINT to a first electrode (e.g., a first electrode 1710 in FIG. 10) of an organic light emitting diode to be described later. For example, the second pad 1580 may be located between the first active pattern 1110 and the first electrode, and may contact the first active pattern 1110.

The fourth signal line 1542 may extend along the first direction D1. For example, the fourth gate signal GB may be provided to the fourth signal line 1542. According to some embodiments, the fourth signal line 1542 may contact the second gate electrode 1260. Accordingly, the fourth gate signal GB provided through the fourth signal line 1542 may be transmitted to the second gate electrode 1260.

The anode initialization voltage connection line 1590 may electrically connect the anode initialization voltage line 1270 and the first active pattern 1110. The anode initialization voltage AINT may be transmitted to the first active pattern 1110 through the anode initialization voltage connection line 1590.

For example, the fourth conductive pattern 1500 may include a metal, an alloy, a conductive metal oxide, a transparent conductive material, and the like. For example, the fourth conductive pattern 1500 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. According to some embodiments, in order to reduce the electrical resistance of the fourth conductive pattern 1500, the fourth conductive pattern 1500 may include aluminum ("Al"). For example, the fourth conductive pattern 1500 may have a Ti/Al/Ti structure in which titanium ("Ti") and aluminum ("Al") are alternately arranged.

A first via insulating layer (e.g., a first via insulating layer VIA1 in FIG. 10) may cover the fourth conductive pattern 1500 and may be located on the second interlayer insulating layer. The first via insulating layer may include an organic insulating material. For example, the first via insulating layer may include a photoresist, a polyacrylic resin, a polyimide resin, an acrylic resin, or the like.

Meanwhile, according to some embodiments, a data line (e.g., a data line 1610 in FIG. 12) and/or a driving voltage line (e.g., a driving voltage line 1620 in FIG. 10) may be located on the first via insulating layer. For example, the data line may correspond to the data line DL described with reference to FIG. 1, and the driving voltage line may correspond to the driving voltage line PL described with reference to FIG. 1.

In addition, a second via insulating layer (e.g., a second via insulating layer VIA2 in FIG. 10) may be located on the first via insulating layer to cover the data line and the driving voltage line, and an organic light emitting diode (e.g., an organic light emitting diode 1700 in FIG. 10) may be located on the second via insulating layer.

Figure 10:
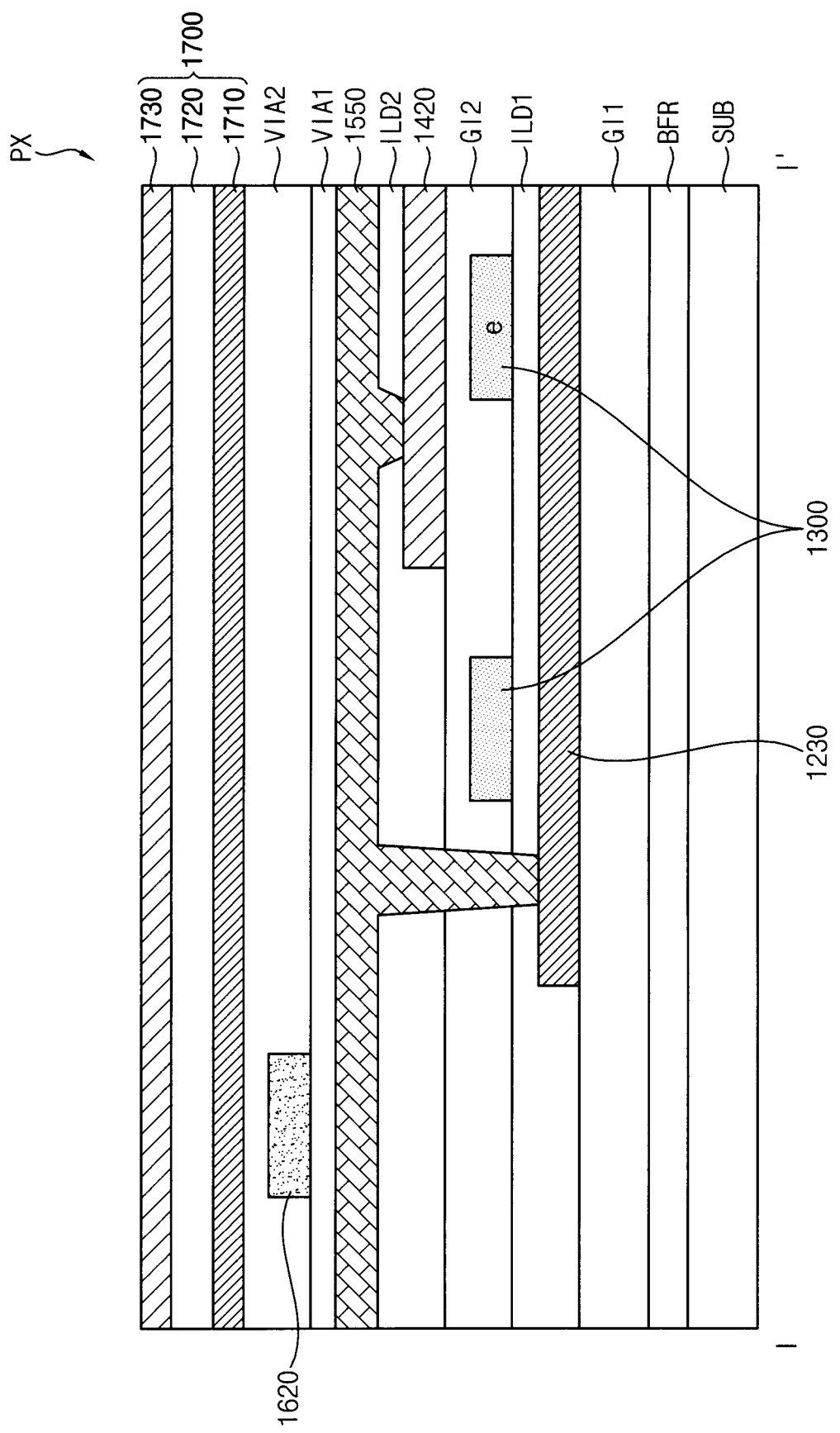
FIG. 10 is a cross-sectional view taken along the line I-I' of FIG. 9 according to some embodiments.

FIG. 10 is a cross-sectional view taken along the line I-I' of FIG. 9.

Referring to FIGS. 2, 9, and 10, the pixel structure PX may have a structure in which the substrate SUB, the buffer layer BFR, the first gate insulating layer GI1, the second lower electrode 1230, the first interlayer insulating layer ILD1, the second active pattern 1300, the second gate insulating layer GI2, the second upper electrode 1420, the second interlayer insulating layer ILD2, the second signal line 1550, the first via insulation layer VIA1, the driving voltage line 1620, the second via insulating layer VIA2, the first electrode 1710, an emission layer 1720, and a second electrode 1730 are sequentially arranged.

According to some embodiments, the second lower electrode 1230 and the second upper electrode 1420 may include molybdenum ("Mo"), an alloy containing molybdenum, and the like, and the second signal line 1550 may have a Ti/Al/Ti structure including aluminum ("Al"). Accordingly, the electric resistance of the second signal line 1550 may be smaller than the electric resistance of the second lower electrode 1230 or the electric resistance of the second upper electrode 1420. As the line for transmitting the second gate signal GC is implemented as the second signal line 1550, the transmission speed of the second gate signal GC may be improved, and the voltage level of the second gate signal GC may be maintained.

According to some embodiments, the channel region e of the second active pattern 1300, the second lower electrode 1230, and the second upper electrode 1420 may overlap each other. Accordingly, the second active pattern 1300, the second lower electrode 1230, and the second upper electrode 1420 may constitute the third transistor T3 having a dual-gate structure. As the third transistor T3 is implemented in a dual-gate structure, a turn-on characteristic and/or a turn-off characteristic of the third transistor T3 may be improved.

Figure 11:
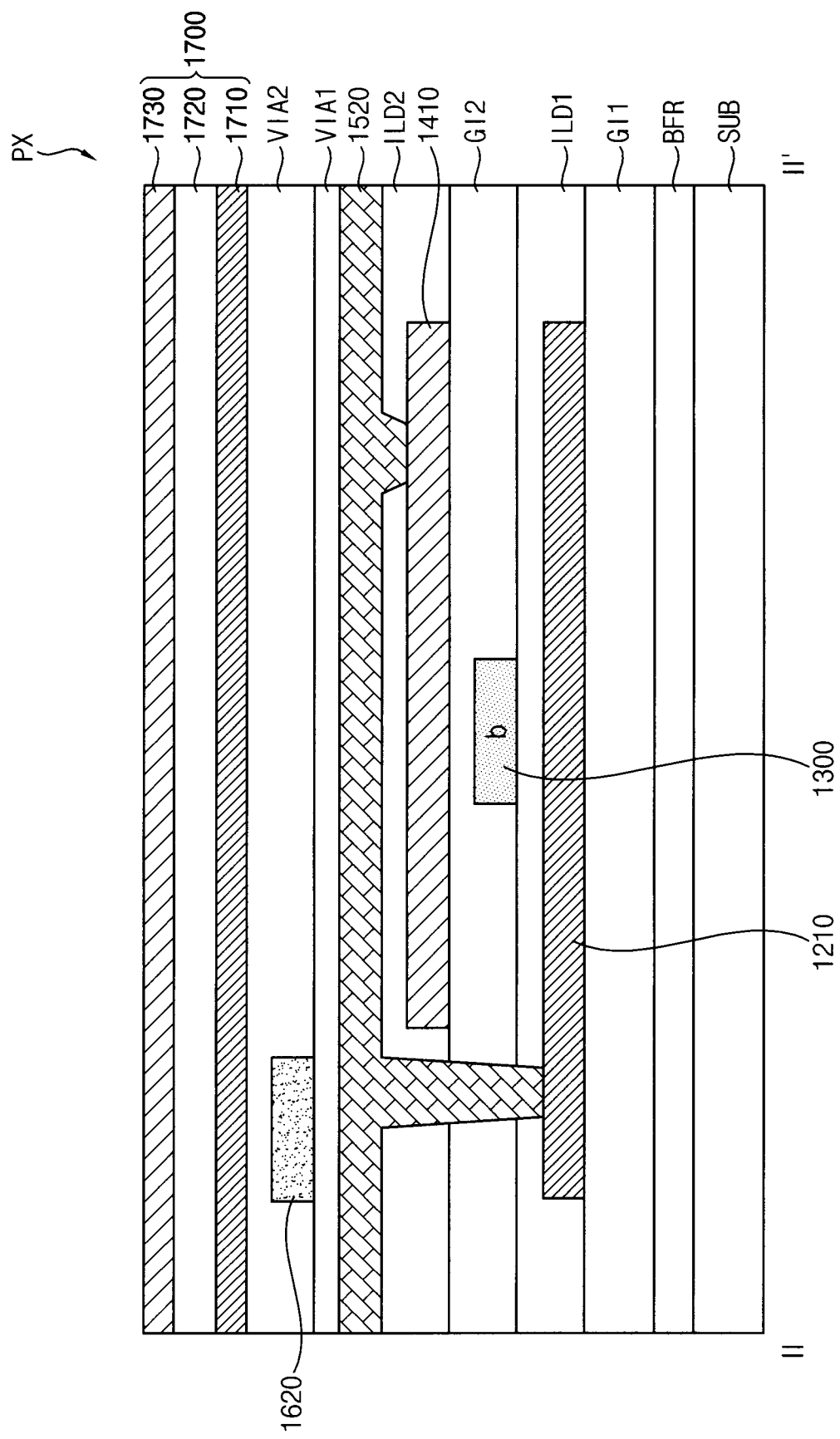
FIG. 11 is a cross-sectional view taken along the line II-II' of FIG. 9 according to some embodiments.

FIG. 11 is a cross-sectional view taken along the line II-II' of FIG. 9.

Referring to FIGS. 2, 9, and 11, the pixel structure PX may have a structure in which the substrate SUB, the buffer layer BFR, the first gate insulating layer GI1, the first lower electrode 1210, the first interlayer insulating layer ILD1, the second active pattern 1300, the second gate insulating layer GI2, the first upper electrode 1410, the second interlayer insulating layer ILD2, the first signal line 1520, the first via insulation layer VIA1, the driving voltage line 1620, the second via insulating layer VIA2, the first electrode 1710, the emission layer 1720, and the second electrode 1730 are sequentially arranged.

As described above, the first signal line 1520 may contact the first lower electrode 1210 and the first upper electrode 1410. Accordingly, the third gate signal GI provided through the first signal line 1520 may be transmitted to the first lower electrode 1210 and the first upper electrode 1410.

According to some embodiments, the first lower electrode 1210 and the first upper electrode 1410 may include molybdenum ("Mo"), an alloy containing molybdenum, and the like, and the first signal line 1520 may have a Ti/Al/Ti structure including aluminum ("Al"). Accordingly, the electric resistance of the first signal line 1520 may be smaller than the electric resistance of the first lower electrode 1210 or the electric resistance of the first upper electrode 1410. As the line for transmitting the third gate signal GI is implemented as the first signal line 1520, the transmission speed of the third gate signal GI may be improved, and the voltage level of the third gate signal GI may be maintained.

According to some embodiments, the channel region b of the second active pattern 1300, the first lower electrode 1210, and the first upper electrode 1410 may overlap each other. Accordingly, the second active pattern 1300, the first lower electrode 1210, and the first upper electrode 1410 may constitute the fourth transistor T4 having a dual-gate structure. As the fourth transistor T4 is implemented in a dual-gate structure, a turn-on characteristic and/or a turn-off characteristic of the fourth transistor T4 may be improved.

Figure 12:
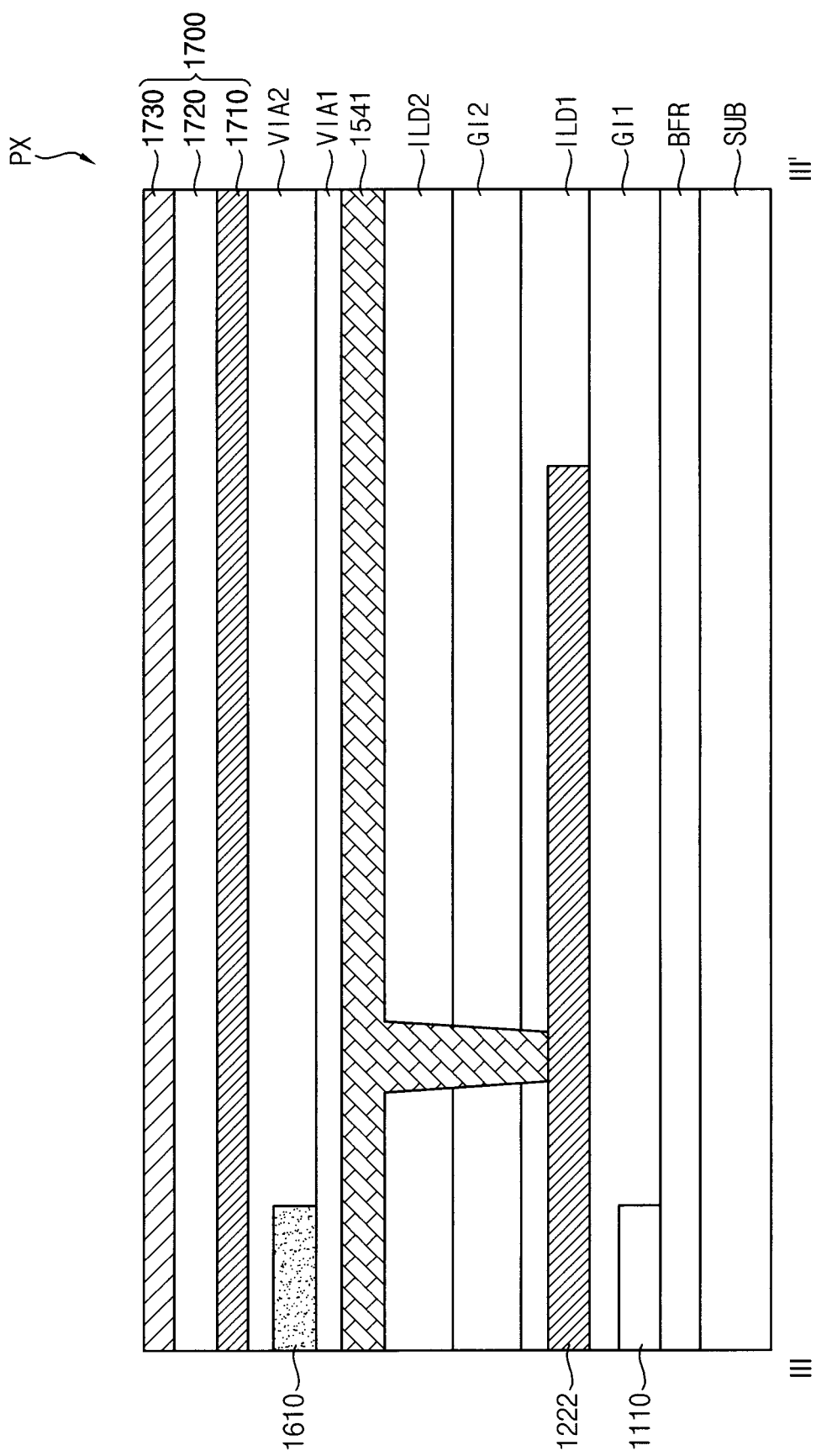
FIG. 12 is a cross-sectional view taken along the line III-III' of FIG. 9 according to some embodiments.

FIG. 12 is a cross-sectional view taken along the line III-III' of FIG. 9.

Referring to FIGS. 2, 9, and 12, the pixel structure PX may have a structure in which the substrate SUB, the buffer layer BFR, the first active pattern 1110, the first gate insulating layer GI1, the second portion 1222 of the first gate electrode, the first interlayer insulating layer ILD1, the second gate insulating layer GI2, the second interlayer insulating layer ILD2, the third signal line 1541, the first via insulating layer VIA1, the data line 1610, the second via insulating layer VIA2, the first electrode 1710, the emission layer 1720, and the second electrode 1730 are sequentially arranged.

As described above, the third signal line 1541 may contact the second portion 1222. Accordingly, the first gate signal GW provided through the third signal line 1541 may be transmitted to the second portion 1222.

According to some embodiments, the second portion 1222 may include molybdenum ("Mo"), an alloy containing molybdenum, and the like, and the third signal line 1541 may have a Ti/Al/Ti structure including aluminum ("Al"). Accordingly, the electrical resistance of the third signal line 1541 may be smaller than the electrical resistance of the second portion 1222. As the line for transmitting the first gate signal GW is implemented as the third signal line 1541, the transmission speed of the first gate signal GW may be improved, and the voltage level of the first gate signal GW may be maintained.

According to some embodiments, the first active pattern 1110 and the second portion 1222 may overlap each other. Accordingly, the first active pattern 1110 and the second portion 1222 may constitute the second transistor T2.

Figure 13:
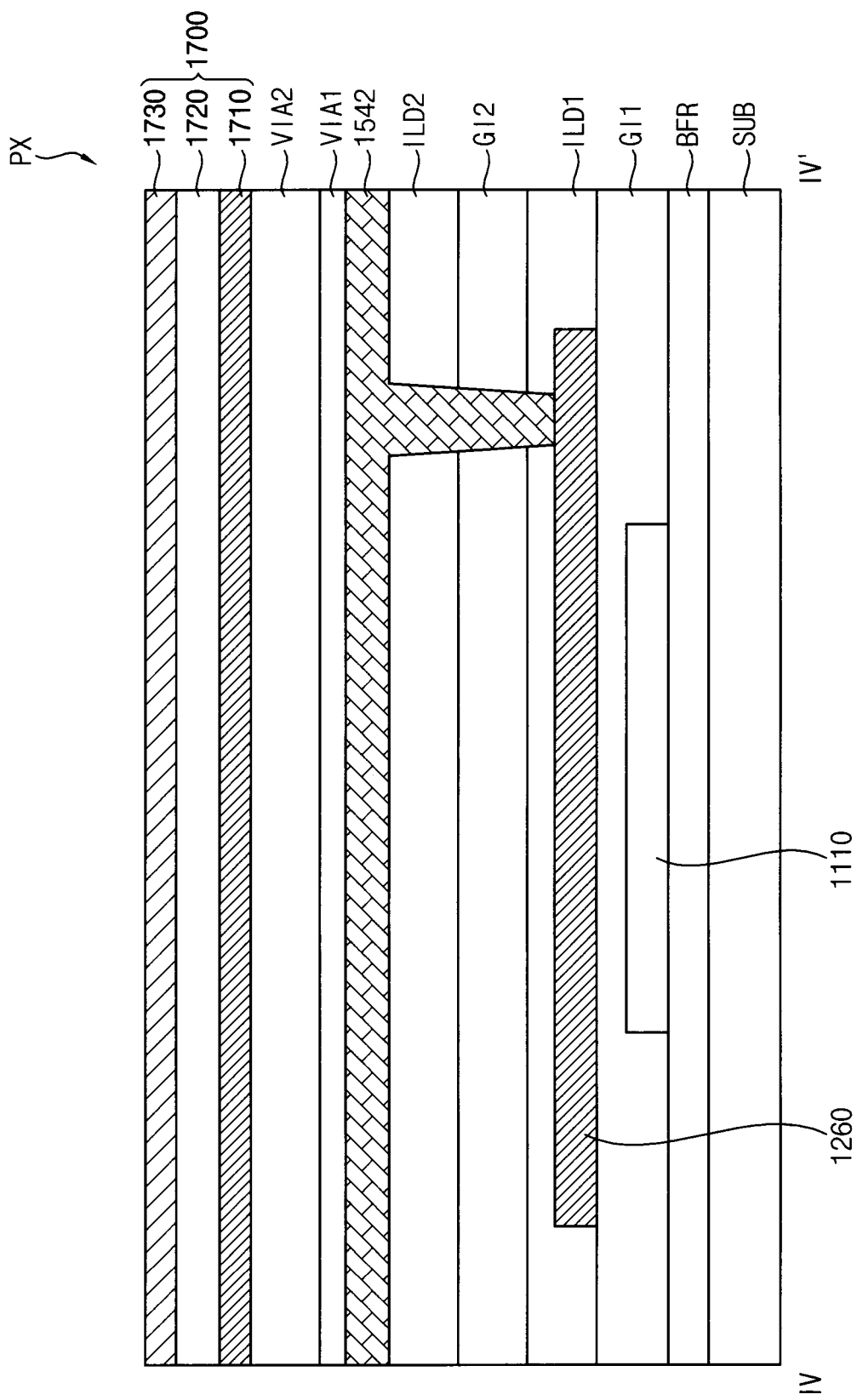
FIG. 13 is a cross-sectional view taken along the line IV-IV' of FIG. 9 according to some embodiments.

FIG. 13 is a cross-sectional view taken along the line IV-IV' of FIG. 9.

Referring to FIGS. 2, 9, and 13, the pixel structure PX may have a structure in which the substrate SUB, the buffer layer BFR, the first gate insulating layer GI1, the second gate electrode 1260, the first interlayer insulating layer ILD1, the second gate insulating layer GI2, the second interlayer insulating layer ILD2, the fourth signal line 1542, the first via insulating layer VIA1, the second via insulating layer VIA2, the first electrode 1710, the emission layer 1720, and the second electrode 1730 are sequentially arranged.

As described above, the fourth signal line 1542 may contact the second gate electrode 1260. Accordingly, the fourth gate signal GB provided through the fourth signal line 1542 may be transmitted to the second gate electrode 1260.

According to some embodiments, the second gate electrode 1260 may include molybdenum ("Mo"), an alloy containing molybdenum, and the like, and the fourth signal line 1542 may have a Ti/Al/Ti structure including aluminum ("Al"). Accordingly, the electrical resistance of the fourth signal line 1542 may be smaller than the electrical resistance of the second gate electrode 1260. As the line for transmitting the fourth gate signal GB is implemented as the fourth signal line 1542, the transmission speed of the fourth gate signal GB may be improved, and the voltage level of the fourth gate signal GB may be maintained.

According to some embodiments, the first active pattern 1110 and the second gate electrode 1260 may overlap each other. Accordingly, the first active pattern 1110 and the second gate electrode 1260 may constitute the seventh transistor T7.

Figure 14:
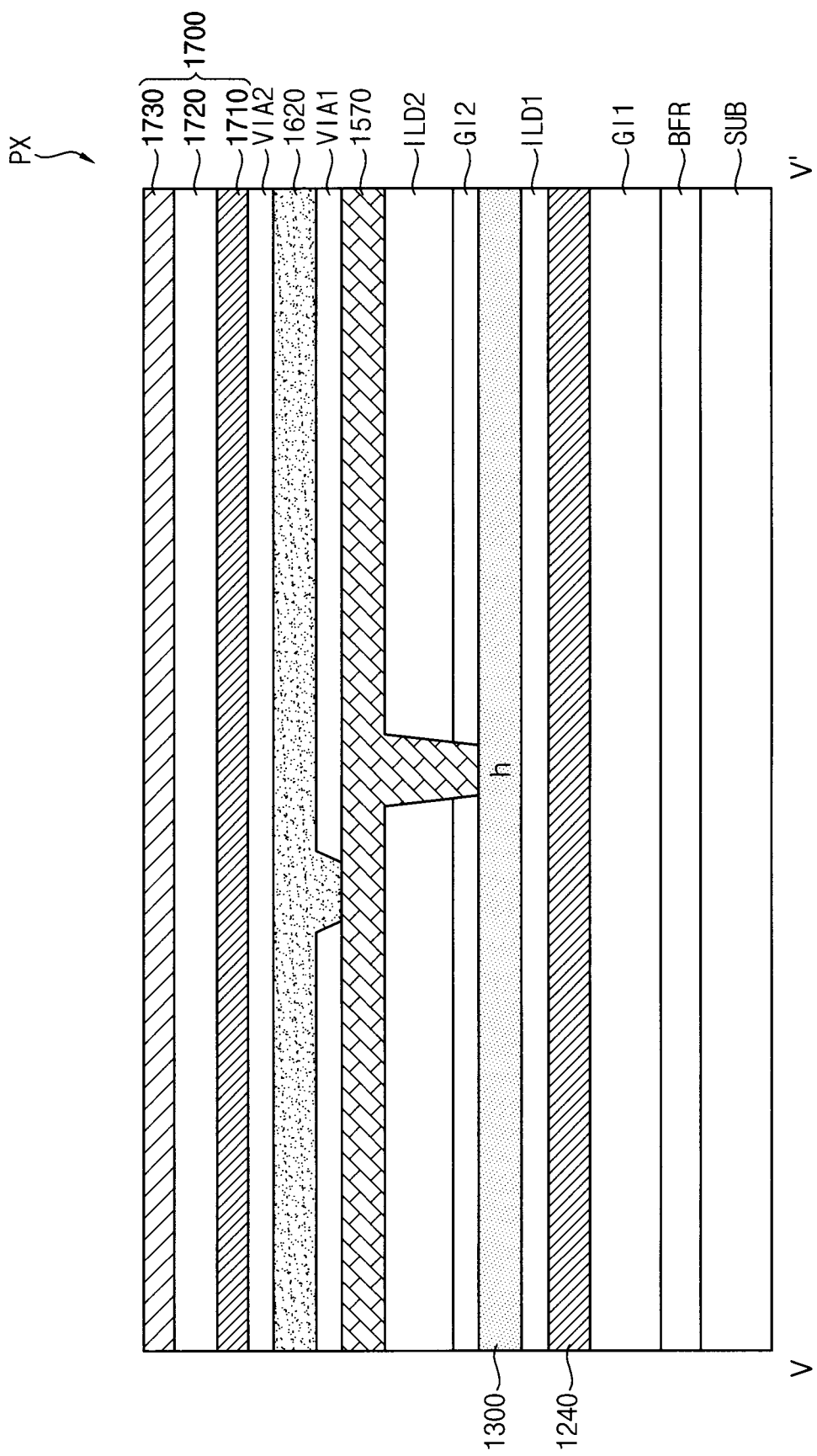
FIG. 14 is a cross-sectional view taken along the line V-V' of FIG. 9 according to some embodiments.

FIG. 14 is a cross-sectional view taken along the line V-V' of FIG. 9.

Referring to FIGS. 2, 9, and 14, the pixel structure PX may have a structure in which the substrate SUB, the buffer layer BFR, the first gate insulating layer GI1, the third gate electrode 1240, the first interlayer insulating layer ILD1, the second active pattern 1300, the second gate insulating layer GI2, the second interlayer insulating layer ILD2, the high power voltage pattern 1570, the first via insulating layer VIA1, the driving voltage line 1620, the second via insulating layer VIA2, the first electrode 1710, the emission layer 1720, and the second electrode 1730 are sequentially arranged.

As described above, the second active pattern 1300 may contact the high power voltage pattern 1570 in the fourth portion h, and the high power voltage pattern 1570 may contact the driving voltage line 1620. Because the second active pattern 1300 is electrically connected to the driving voltage line 1620, the second active pattern 1300 may receive the high power voltage ELVDD.

Figure 15:
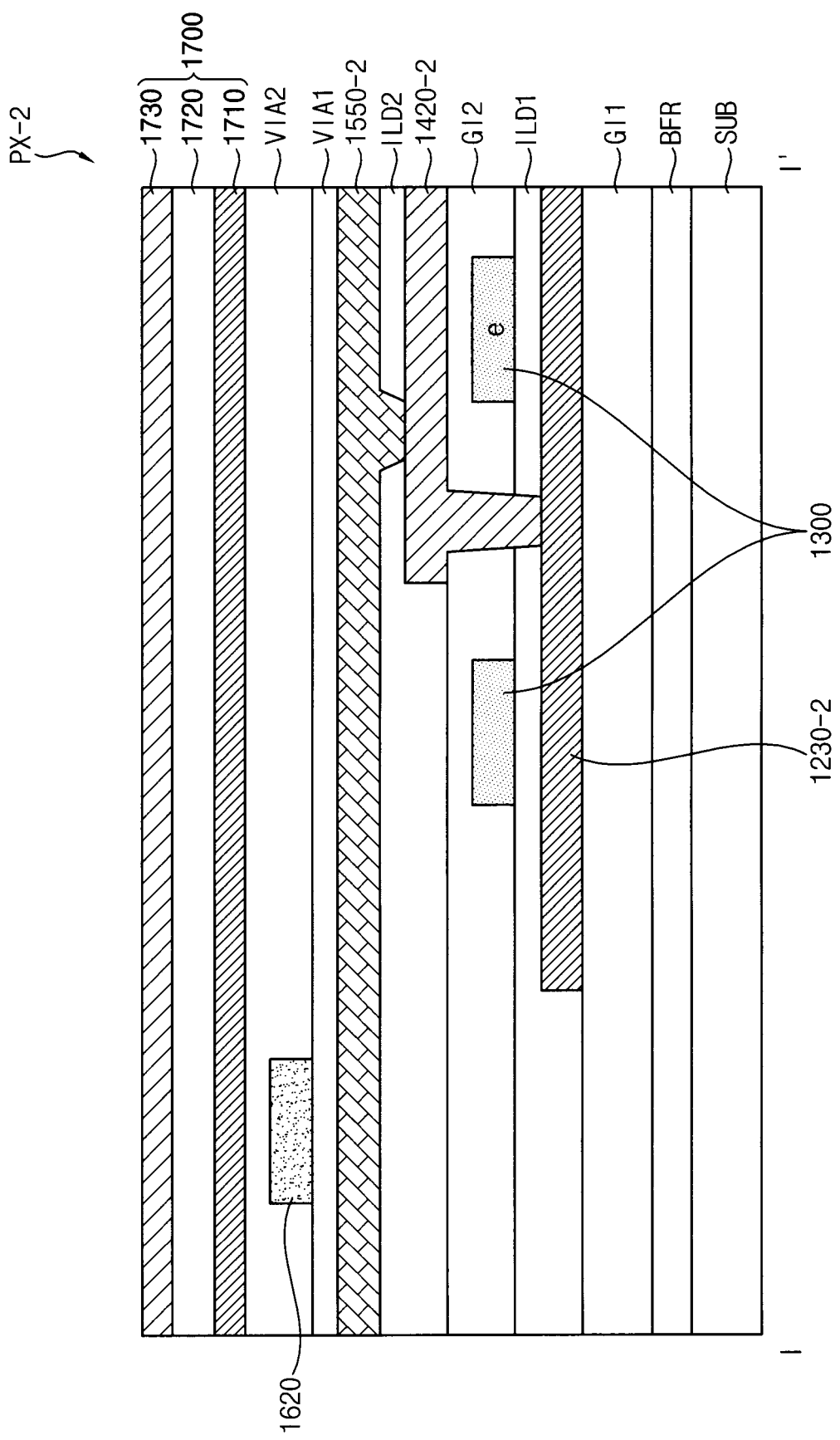
FIG. 15 is a cross-sectional view illustrating a pixel structure included in the display device of FIG. 1 according to some embodiments.
Figure 16:
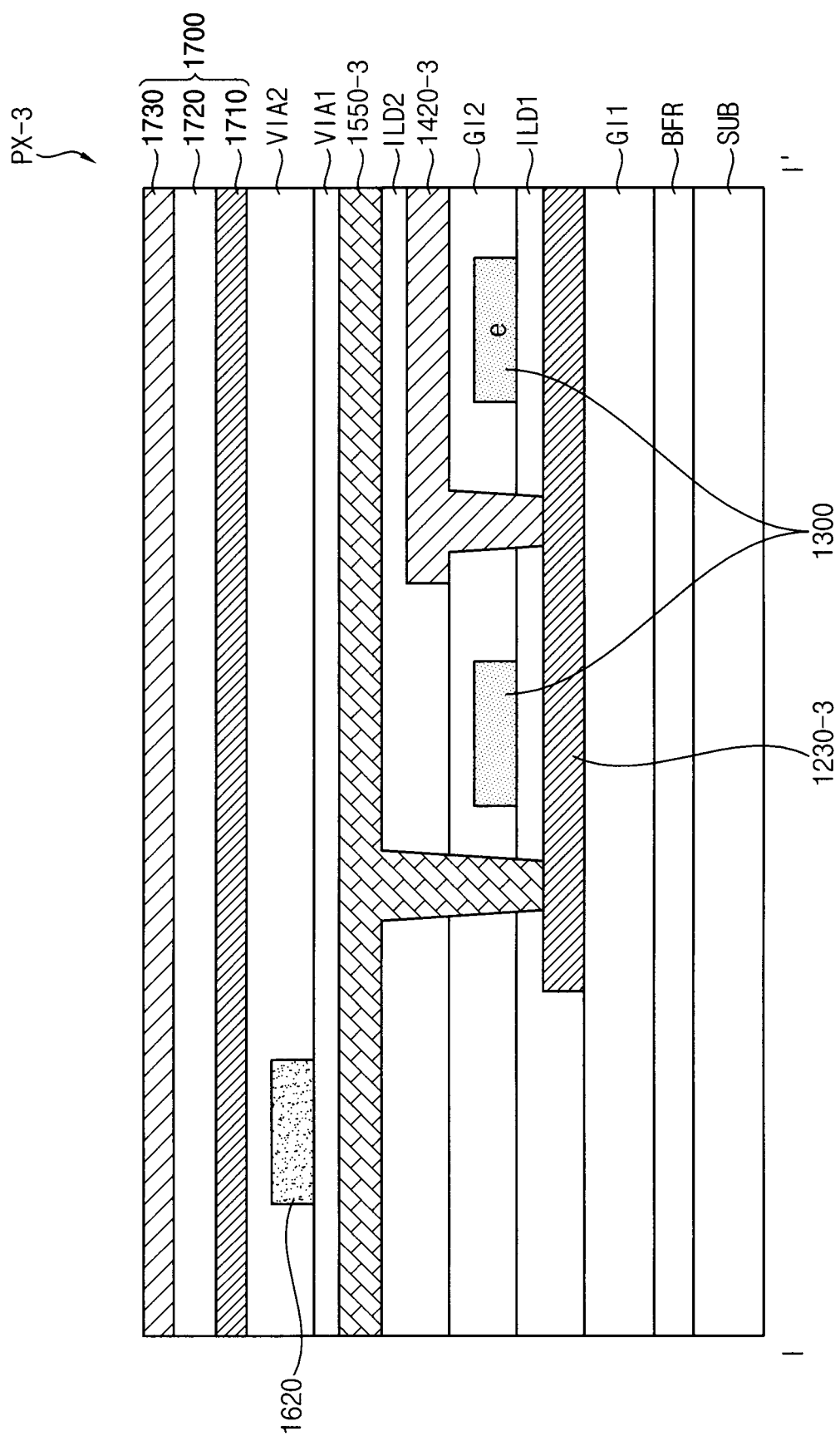
FIG. 16 is a cross-sectional view illustrating a pixel structure included in the display device of FIG. 1 according to some embodiments.

FIG. 15 is a cross-sectional view illustrating a pixel structure included in the display device of FIG. 1 according to some embodiments. FIG. 16 is a cross-sectional view illustrating a pixel structure included in the display device of FIG. 1 according to some embodiments.

Referring to FIG. 15, the pixel structure PX-2 may have a structure in which the substrate SUB, the buffer layer BFR, the first gate insulating layer GI1, a second lower electrode 1230-2, the first interlayer insulating layer ILD1, the second active pattern 1300, the second gate insulating layer GI2, a second upper electrode 1420-2, the second interlayer insulating layer ILD2, a second signal line 1550-2, the first via insulating layer VIA1, the driving voltage line 1620, the second via insulating layer VIA2, the first electrode 1710, the emission layer 1720, and the second electrode 1730 are sequentially arranged. However, because the pixel structure PX-2 may substantially the same as the pixel structure PX described with reference to FIG. 10, except for a contact relationship among the second lower electrode 1230-2, the second upper electrode 1420-2, and the second signal line 1550-2, the contact relationship among the second lower electrode 1230-2, the second upper electrode 1420-2, and the second signal line 1550-2 will be described in more detail.

The second signal line 1550-2 may contact the second upper electrode 1420-2, and the second upper electrode 1420-2 may contact the second lower electrode 1230-2. Accordingly, the second gate signal GC provided through the second signal line 1550-2 may be transmitted to the second lower electrode 1230-2 and the second upper electrode 1420-2.

Referring to FIG. 16, the pixel structure PX-3 may have a structure in which the substrate SUB, the buffer layer BFR, the first gate insulating layer GI1, a second lower electrode 1230-3, the first interlayer insulating layer ILD1, the second active pattern 1300, the second gate insulating layer GI2, a second upper electrode 1420-3, the second interlayer insulating layer ILD2, a second signal line 1550-3, the first via insulating layer VIA1, the driving voltage line 1620, the second via insulating layer VIA2, the first electrode 1710, the emission layer 1720, and the second electrode 1730 are sequentially arranged. However, because the pixel structure PX-3 may substantially the same as the pixel structure PX described with reference to FIG. 10, except for a contact relationship among the second lower electrode 1230-3, the second upper electrode 1420-3, and the second signal line 1550-3, the contact relationship among the second lower electrode 1230-3, the second upper electrode 1420-3, and the second signal line 1550-3 will be described in more detail.

The second signal line 1550-3 may contact the second lower electrode 1230-3, and the second upper electrode 1420-3 may contact the second lower electrode 1230-3. Accordingly, the second gate signal GC provided through the second signal line 1550-3 may be transmitted to the second lower electrode 1230-3 and the second upper electrode 1420-3.

FIGS. 17 to 22 are layout diagrams illustrating a pixel structure included in the display device of FIG. 1 according to some embodiments.

Figure 17:
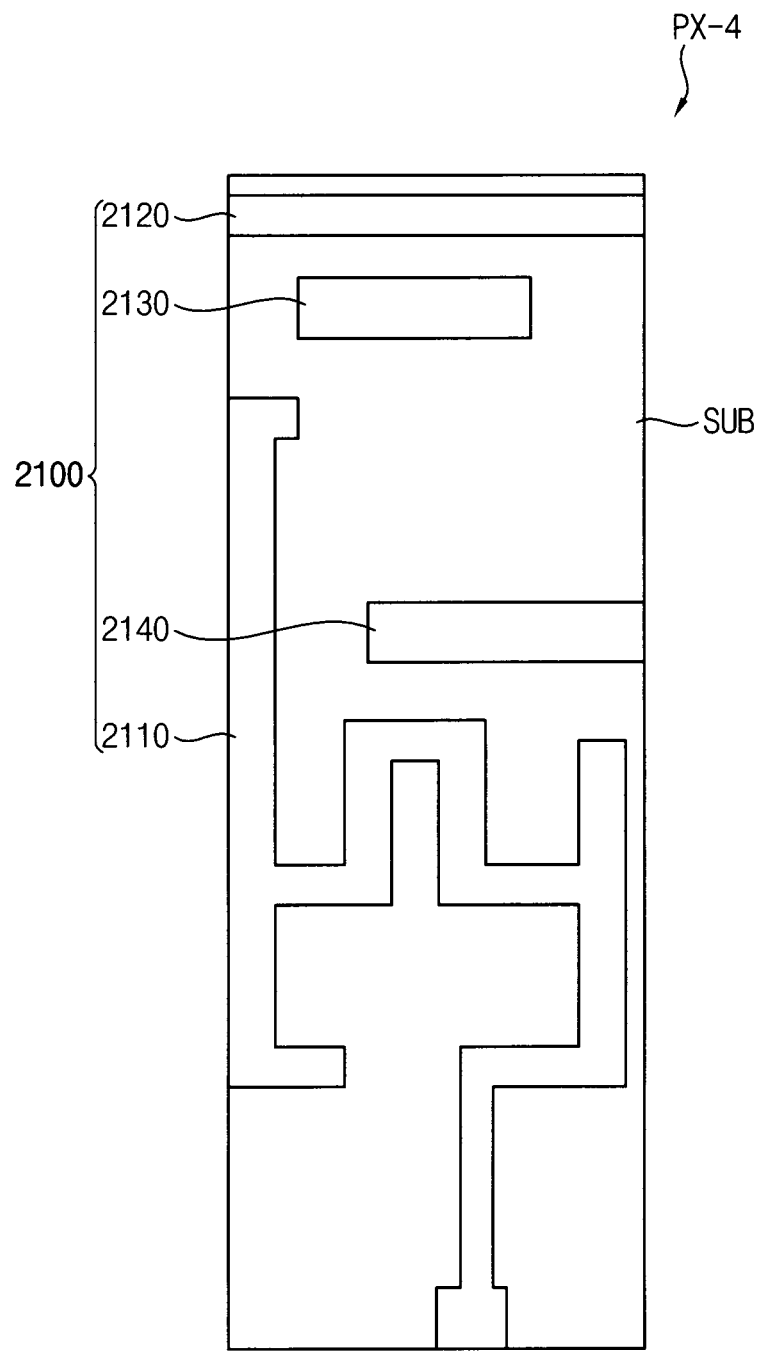
FIGS. 17 to 22 are layout diagrams illustrating a pixel structure included in the display device of FIG. 1 according to some embodiments.

Referring to FIG. 17, a pixel structure PX-4 may include a substrate SUB and a first conductive pattern 2100 located on the substrate SUB. The first conductive pattern 2100 may include a first active pattern 2110, a gate initialization voltage line 2120, a first lower electrode 2130, and a second lower electrode 2140.

The substrate SUB may include a glass substrate, a quartz substrate, a plastic substrate, or the like. According to some embodiments, the substrate SUB may include a plastic substrate, and accordingly, the display device 10 may have a flexible characteristic. In this case, the substrate SUB may have a structure in which at least one organic film layer and at least one barrier layer are alternately stacked. For example, the organic film layer may be formed using an organic material such as polyimide, and the barrier layer may be formed using an inorganic material.

A buffer layer (e.g., a buffer layer BFR in FIG. 23) may be located on the substrate SUB. The buffer layer may prevent or reduce diffusion of metal atoms or impurities from the substrate SUB into the first conductive pattern 2100. In addition, the buffer layer may uniformly form the first conductive pattern 2100 by controlling a heat supply rate during a crystallization process for forming the first conductive pattern 2100.

The first active pattern 2110 may be located on the buffer layer. According to some embodiments, the first active pattern 2110 may include a silicon semiconductor. For example, the silicon semiconductor may include amorphous silicon, polycrystalline silicon, or the like.

According to some embodiments, ions may be selectively implanted into the first active pattern 2110. For example, when the first, second, fifth, sixth, and seventh transistors T1, T2, T5, T6, and T7 are PMOS transistors, the first active pattern 2110 may include a source region and a drain region to which positive ions are injected, and a channel region to which the positive ions are not injected.

The gate initialization voltage line 2120 may extend along the first direction D1. According to some embodiments, the gate initialization voltage line 2120 may provide the gate initialization voltage VINT to the fourth transistor T4. According to some embodiments, the gate initialization voltage line 2120 may be located on the first active pattern 2110.

The first lower electrode 2130 may extend along the first direction D1 and may have an island shape. For example, the first lower electrode 2130 may function as a lower gate electrode of the fourth transistor T4. For example, the first lower electrode 2130 may contact a first signal line (e.g., a first signal line 2520 in FIG. 24) to be described later.

The second lower electrode 2140 may extend along the first direction D1 and may have an island shape. For example, the second lower electrode 2140 may function as a lower gate electrode of the third transistor T3. For example, the second lower electrode 2140 may contact a second signal line (e.g., a second signal line 2550 in FIG. 23) to be described later.

A first gate insulating layer (e.g., a first gate insulating layer GI1 in FIG. 23) may cover the first conductive pattern 2100 and may be located on the substrate SUB. The first gate insulating layer may include an insulating material. For example, the first gate insulating layer may include silicon oxide, silicon nitride, titanium oxide, tantalum oxide, or the like.

Figure 18:
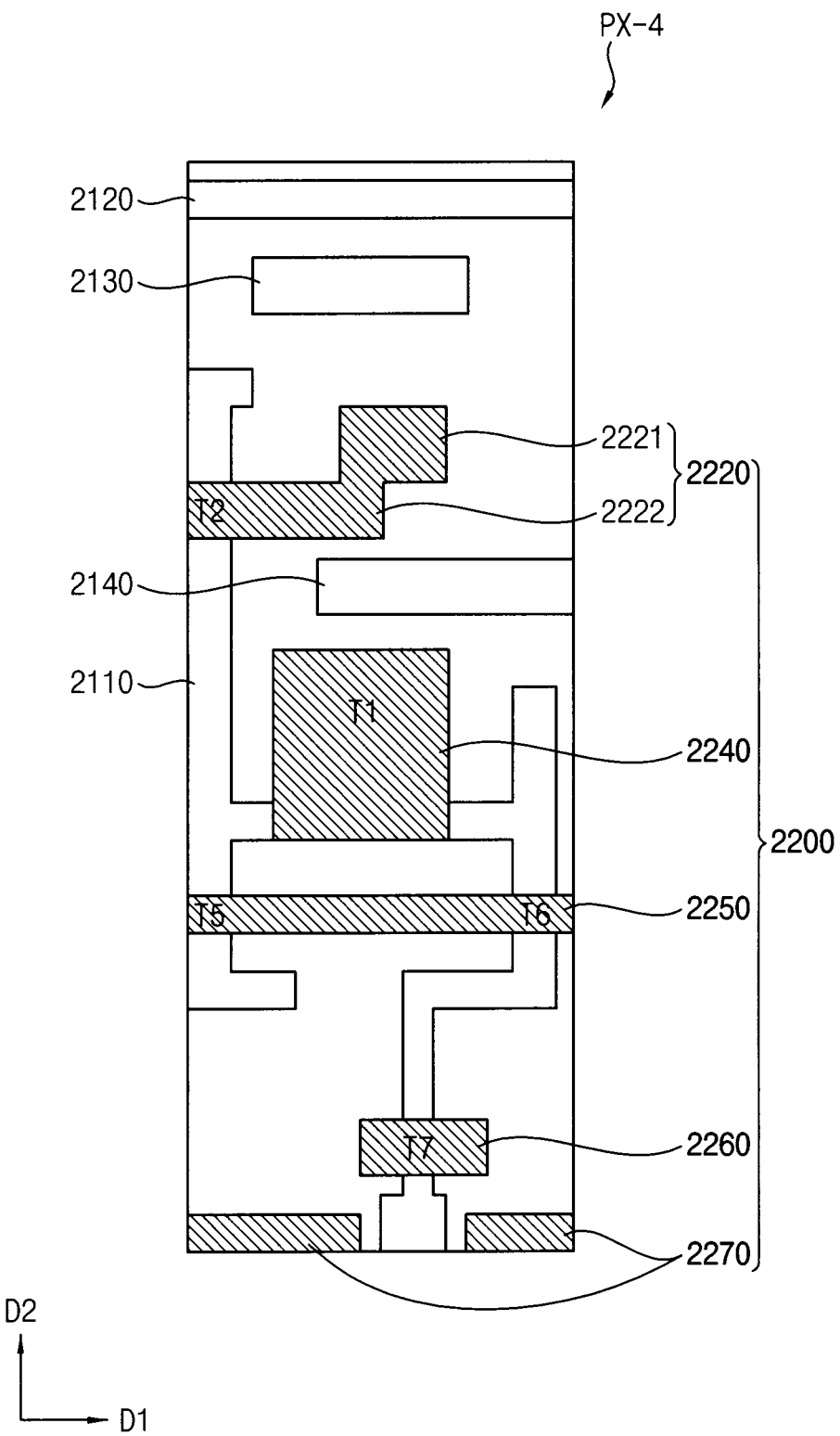

Referring to FIG. 18, a second conductive pattern 2200 may be located on the first gate insulating layer. The second conductive pattern 2200 may include a first gate electrode 2220, a third gate electrode 2240, an emission control line 2250, a second gate electrode 2260, and an anode initialization voltage line 2270. The first gate electrode 2220 may include a first portion 2221 and a second portion 2222 connected to the first portion 2221.

The first gate electrode 2220 may have an island shape. For example, the first portion 2221 may function as the second terminal of the boosting capacitor CBS, and the second portion 2222 may constitute the second transistor T2 together with a part of the first active pattern 2110. For example, the second portion 2222 may be connected to the first portion 2221 and may function as the gate terminal of the second transistor T2.

The third gate electrode 2240 may have an island shape. For example, the third gate electrode 2240 may constitute the first transistor T1 together with a part of the first active pattern 2110.

The emission control line 2250 may extend along the first direction D1. For example, the emission control line 2250 may constitute the fifth and sixth transistors T5 and T6 together with a part of the first active pattern 2110. For example, the emission control signal EM may be provided to the emission control line 2250.

The second gate electrode 2260 may have an island shape. For example, the second gate electrode 2260 may constitute the seventh transistor T7 together with a part of the first active pattern 2110.

The anode initialization voltage line 2270 may extend along the first direction D1. For example, the anode initialization voltage line 2270 may be spaced apart so as not to overlap with the first active pattern 2110. The anode initialization voltage line 2270 may provide the anode initialization voltage AINT to the seventh transistor T7.

For example, the second conductive pattern 2200 may include a metal, an alloy, a conductive metal oxide, a transparent conductive material, or the like. For example, the second conductive pattern 2200 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. According to some embodiments, the second conductive pattern 2200 may include molybdenum ("Mo"), an alloy containing molybdenum, or the like to secure process reliability.

A first interlayer insulating layer (e.g., a first interlayer insulating layer ILD1 in FIG. 23) may cover the second conductive pattern 2200 and may be located on the first gate insulating layer. The first interlayer insulating layer may include an insulating material.

Figure 19:
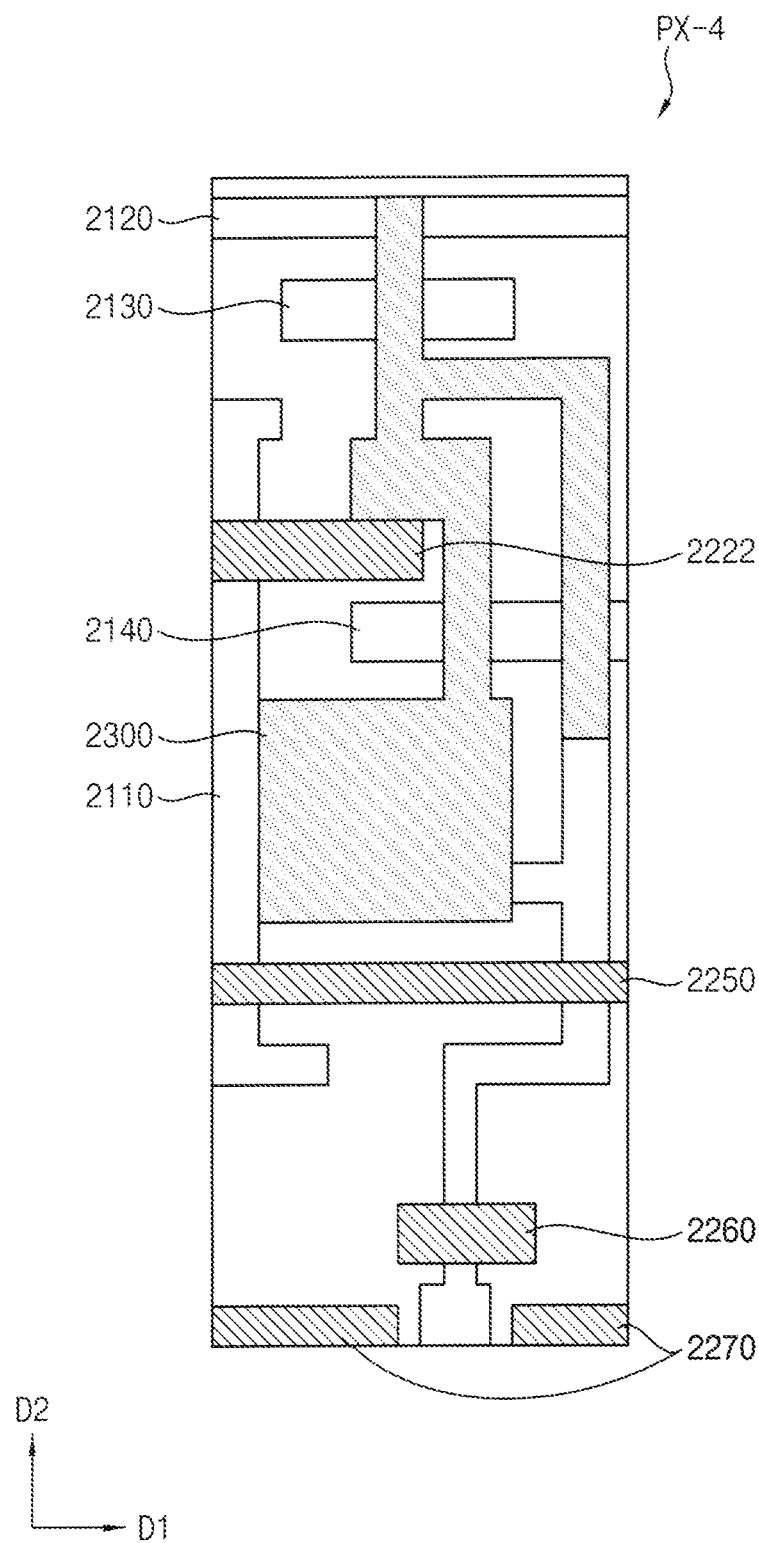

Referring to FIG. 19, a second active pattern 2300 may be located on the first interlayer insulating layer. According to some embodiments, the second active pattern 2300 may include an oxide semiconductor. For example, the second active pattern 2300 may be substantially the same as the second active pattern 2300 described with reference to FIG. 5.

A second gate insulating layer (e.g., a second gate insulating layer GI2 in FIG. 23) may cover the second active pattern 2300 and may be located on the first interlayer insulating layer. The second gate insulating layer may include an insulating material.

Figure 20:
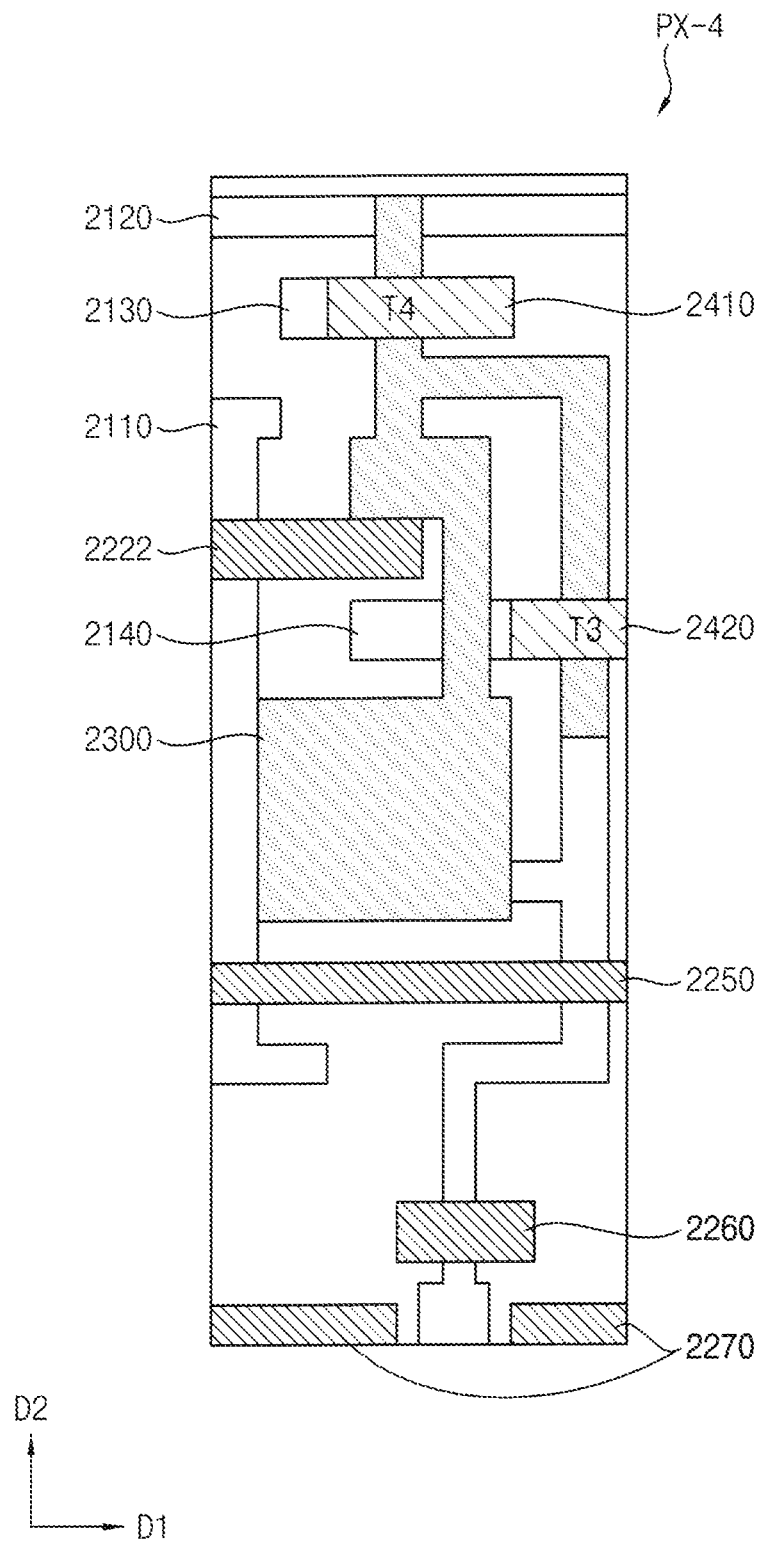

Referring to FIG. 20, a third conductive pattern 2400 may be located on the second gate insulating layer. The third conductive pattern 2400 may include a first upper electrode 2410 and a second upper electrode 2420.

The first upper electrode 2410 may extend along the first direction D1 and may have an island shape. For example, the first upper electrode 2410 may function as an upper gate electrode of the fourth transistor T4. In other words, the fourth transistor T4 may have a dual-gate structure. For example, the first upper electrode 2410 may contact a first signal line (e.g., a first signal line 2520 in FIG. 24) to be described later.

The second upper electrode 2420 may extend along the first direction D1 and may have an island shape. For example, the second upper electrode 2420 may function as an upper gate electrode of the third transistor T3. In other words, the third transistor T3 may have a dual-gate structure. For example, the second upper electrode 2420 may contact a second signal line (e.g., a second signal line 2550 in FIG. 23) to be described later.

Because each of the third and fourth transistors T3 and T4 has a dual-gate structure, turn-on characteristics and/or turn-off characteristics of the third and fourth transistors T3 and T4 may be improved.

For example, the third conductive pattern 2400 may include a metal, an alloy, a conductive metal oxide, a transparent conductive material, and the like. For example, the third conductive pattern 2400 may include the same material as the second conductive pattern 2200. According to some embodiments, the second and third conductive patterns 2200 and 2400 may include molybdenum ("Mo"), an alloy containing molybdenum, or the like to secure process reliability.

A second interlayer insulating layer (e.g., a second interlayer insulating layer ILD2 in FIG. 23) may cover the third conductive pattern 2400 and may be located on the second gate insulating layer. The second interlayer insulating layer may include an insulating material.

Figure 21:
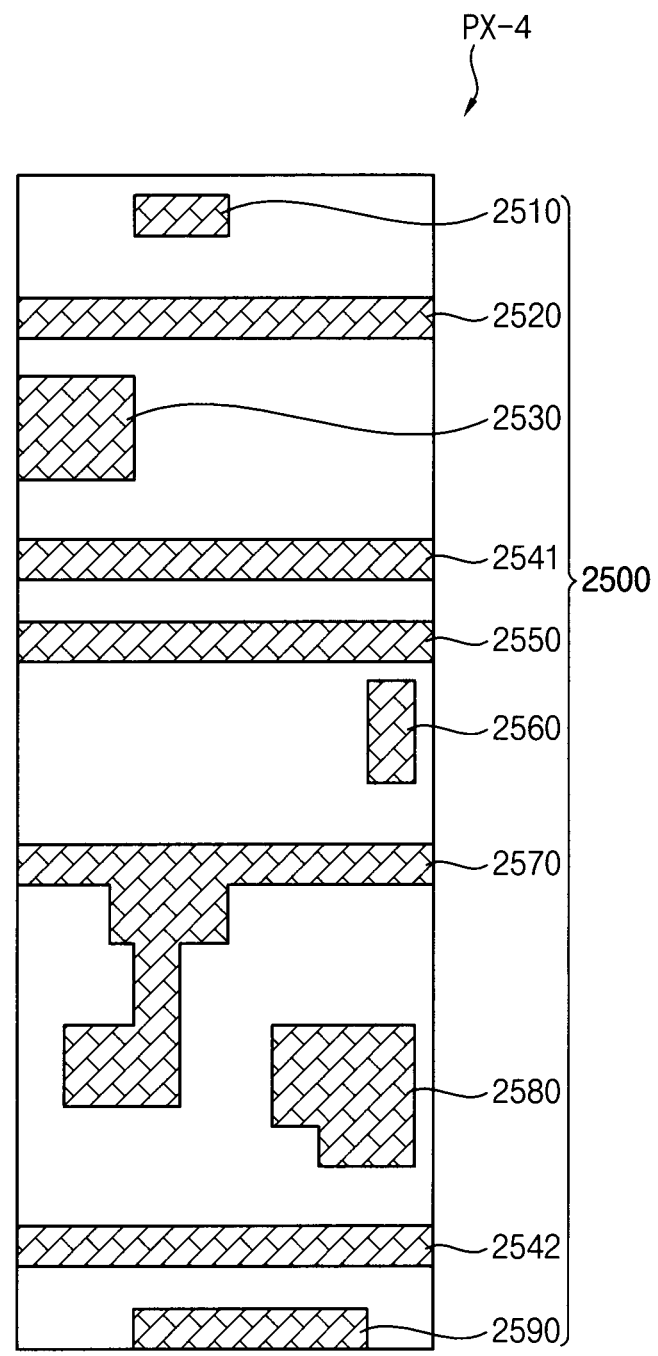
Figure 22:
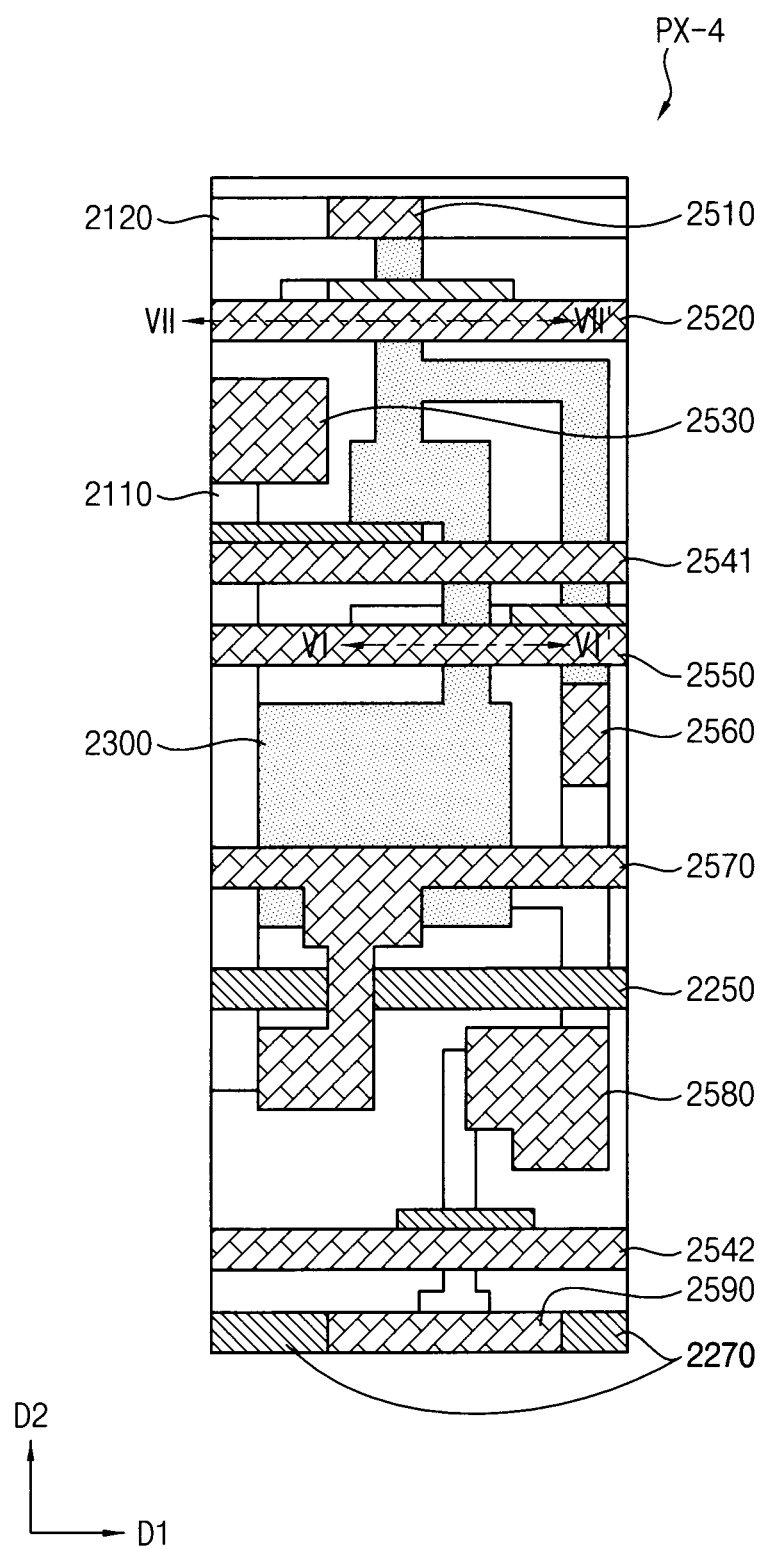

Referring to FIGS. 21 and 22, the fourth conductive pattern 2500 may include a gate initialization voltage connection line 2510, a first signal line 2520, a first pad 2530, a third signal line 2541, a second signal line 2550, a compensation connection pattern 2560, a high power voltage pattern 2570, a second pad 2580, a fourth signal line 2542, and an anode initialization voltage connection line 2590.

The gate initialization voltage connection line 2510 may electrically connect the gate initialization voltage line 2120 and the second active pattern 2300. The gate initialization voltage VINT may be transmitted to the first active pattern 2110 through the gate initialization voltage connection line 2510.

The first signal line 2520 may extend along the first direction D1. For example, the third gate signal GI may be provided to the first signal line 2520. According to some embodiments, the first signal line 2520 may contact the first lower electrode 2130 and the first upper electrode 2410. Accordingly, the third gate signal GI provided through the first signal line 2520 may be transmitted to the first lower electrode 2130 and the first upper electrode 2410.

The first pad 2530 may transmit the data voltage DATA to the first active pattern 2110. For example, the first pad 2530 may be located between the first active pattern 2110 and the data line, and may contact the first active pattern 2110 and the data line.

The third signal line 2541 may extend along the first direction D1. For example, the first gate signal GW may be provided to the third signal line 2541. According to some embodiments, the third signal line 2541 may contact the second portion 2222 of the first gate electrode 2220. Accordingly, the first gate signal GW provided through the third signal line 2541 may be transmitted to the second portion 2222.

The second signal line 2550 may extend along the first direction D1. For example, the second gate signal GC may be provided to the second signal line 2550. According to some embodiments, the second signal line 2550 may contact the second lower electrode 2140 and the second upper electrode 2420. Accordingly, the second gate signal GC may be transmitted to the second lower electrode 2140 and the second upper electrode 2420.

The compensation connection pattern 2560 may electrically connect the second active pattern 2300 and the first active pattern 2110. For example, the second terminal (e.g., the drain terminal of the third transistor T3) of the third transistor T3 may be connected to the second terminal (e.g., the drain terminal of the first transistor T1) of the first transistor T1 through the compensation connection pattern 2560.

The high power voltage pattern 2570 may transmit the high power voltage ELVDD to the second active pattern 2300 and the first active pattern 2110.

The second pad 2580 may provide the driving current and the anode initialization voltage AINT to a first electrode (e.g., a first electrode 1710 in FIG. 23) of an organic light emitting diode to be described later. For example, the second pad 2580 may be located between the first active pattern 2110 and the first electrode, and may contact the first active pattern 2110.

The anode initialization voltage connection line 2590 may electrically connect the anode initialization voltage line 2270 and the first active pattern 2110. The anode initialization voltage AINT may be transmitted to the first active pattern 2110 through the anode initialization voltage connection line 2590.

For example, the fourth conductive pattern 2500 may include a metal, an alloy, a conductive metal oxide, a transparent conductive material, and the like. For example, the fourth conductive pattern 2500 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. According to some embodiments, in order to reduce the electrical resistance of the fourth conductive pattern 2500, the fourth conductive pattern 2500 may have a Ti/Al/Ti structure in which titanium ("Ti") and aluminum ("Al") are alternately arranged.

A first via insulating layer (e.g., a first via insulating layer VIA1 in FIG. 23) may cover the fourth conductive pattern 2500 and may be located on the second interlayer insulating layer. The first via insulating layer may include an organic insulating material. For example, the first via insulating layer may include a photoresist, a polyacrylic resin, a polyimide resin, an acrylic resin, or the like.

Meanwhile, according to some embodiments, a data line and/or a driving voltage line (e.g., a driving voltage line 2620 in FIG. 23) may be located on the first via insulating layer. For example, the data line may correspond to the data line DL described with reference to FIG. 1, and the driving voltage line may correspond to the driving voltage line PL described with reference to FIG. 1.

In addition, a second via insulating layer (for example, a second via insulating layer VIA2 in FIG. 23) may cover the data line and the driving voltage line, and may be located on the second via insulating layer. An organic light emitting diode (e.g., an organic light emitting diode 2700 in FIG. 23) may be located on the second via insulating layer.

Figure 23:
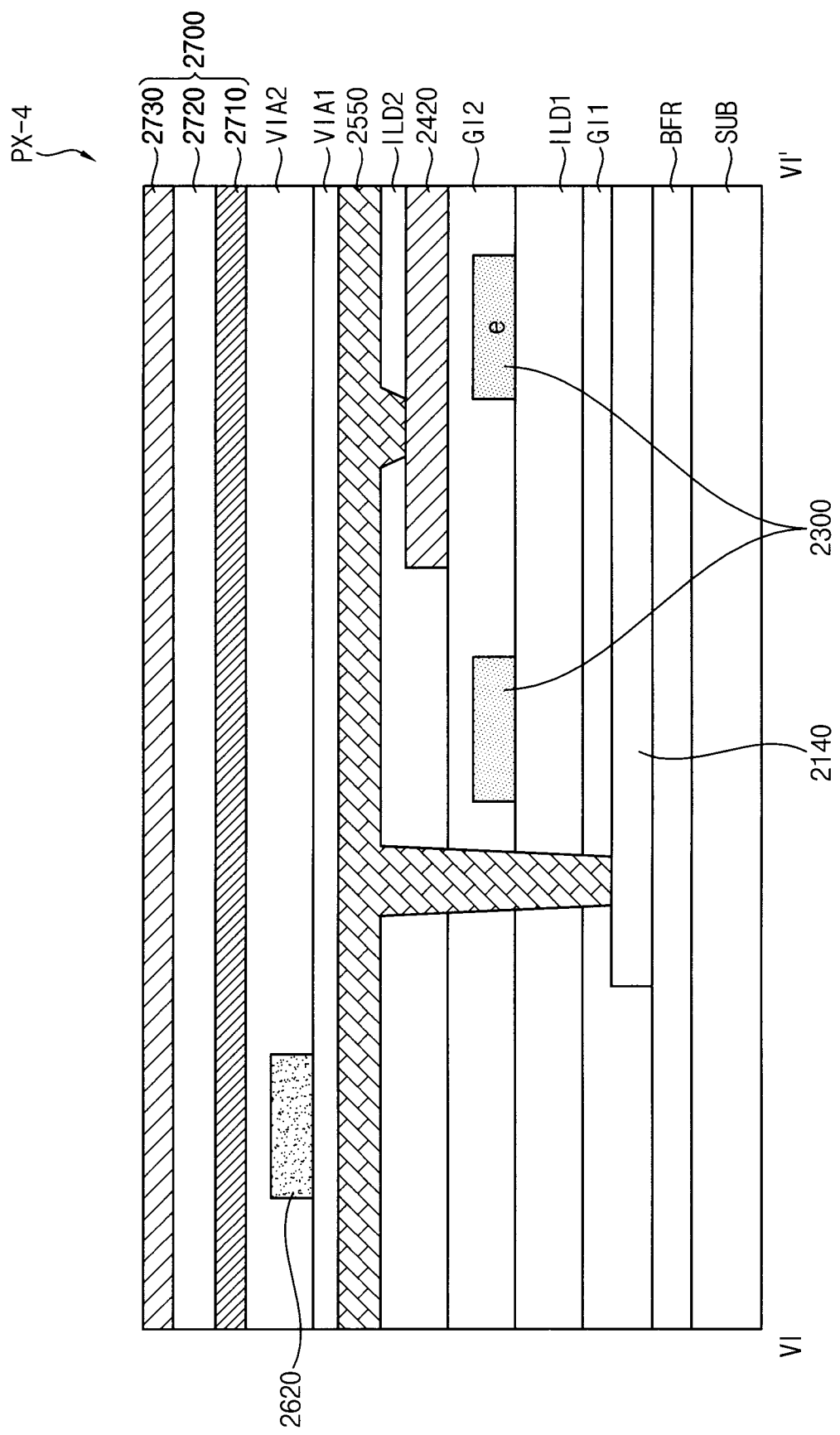
FIG. 23 is a cross-sectional view taken along the line VI-VI' of FIG. 22.

FIG. 23 is a cross-sectional view taken along the line VI-VI' of FIG. 22.

Referring to FIGS. 2, 22, and 23, the pixel structure PX may include the substrate SUB, the buffer layer BFR, the first gate insulating layer GI1, the second lower electrode 2140, the first interlayer insulating layer ILD1, the second active pattern 2300, the second gate insulating layer GI2, the second upper electrode 2420, the second interlayer insulating layer ILD2, the second signal line 2550, the first via insulating layer VIA1, the driving voltage line 2620, the second via insulating layer VIA2, the first electrode 2710, the emission layer 2720, and the second electrode 2730 are sequentially arranged.

As described above, the second signal line 2550 may contact the second lower electrode 2140 and the second upper electrode 2420. Accordingly, the second gate signal GC provided through the second signal line 2550 may be transmitted to the second lower electrode 2140 and the second upper electrode 2420.

According to some embodiments, the second upper electrode 2420 may include molybdenum ("Mo"), an alloy containing the molybdenum, and the like, and the second signal line 2550 may have a Ti/Al/Ti structure including aluminum ("Al"). Accordingly, the electric resistance of the second signal line 2550 may be smaller than the electric resistance of the second upper electrode 2420. As the line for transmitting the second gate signal GC is implemented as the second signal line 2550, the transmission speed of the second gate signal GC may be improved, and the voltage level of the second gate signal GC may be maintained.

According to some embodiments, the second active pattern 2300, the second lower electrode 2140, and the second upper electrode 2420 may overlap each other. Accordingly, the second active pattern 2300, the second lower electrode 2140, and the second upper electrode 2420 may constitute the third transistor T3 having a dual-gate structure. As the third transistor T3 is implemented in a dual-gate structure, a turn-on characteristic and/or a turn-off characteristic of the third transistor T3 may be improved.

Figure 24:
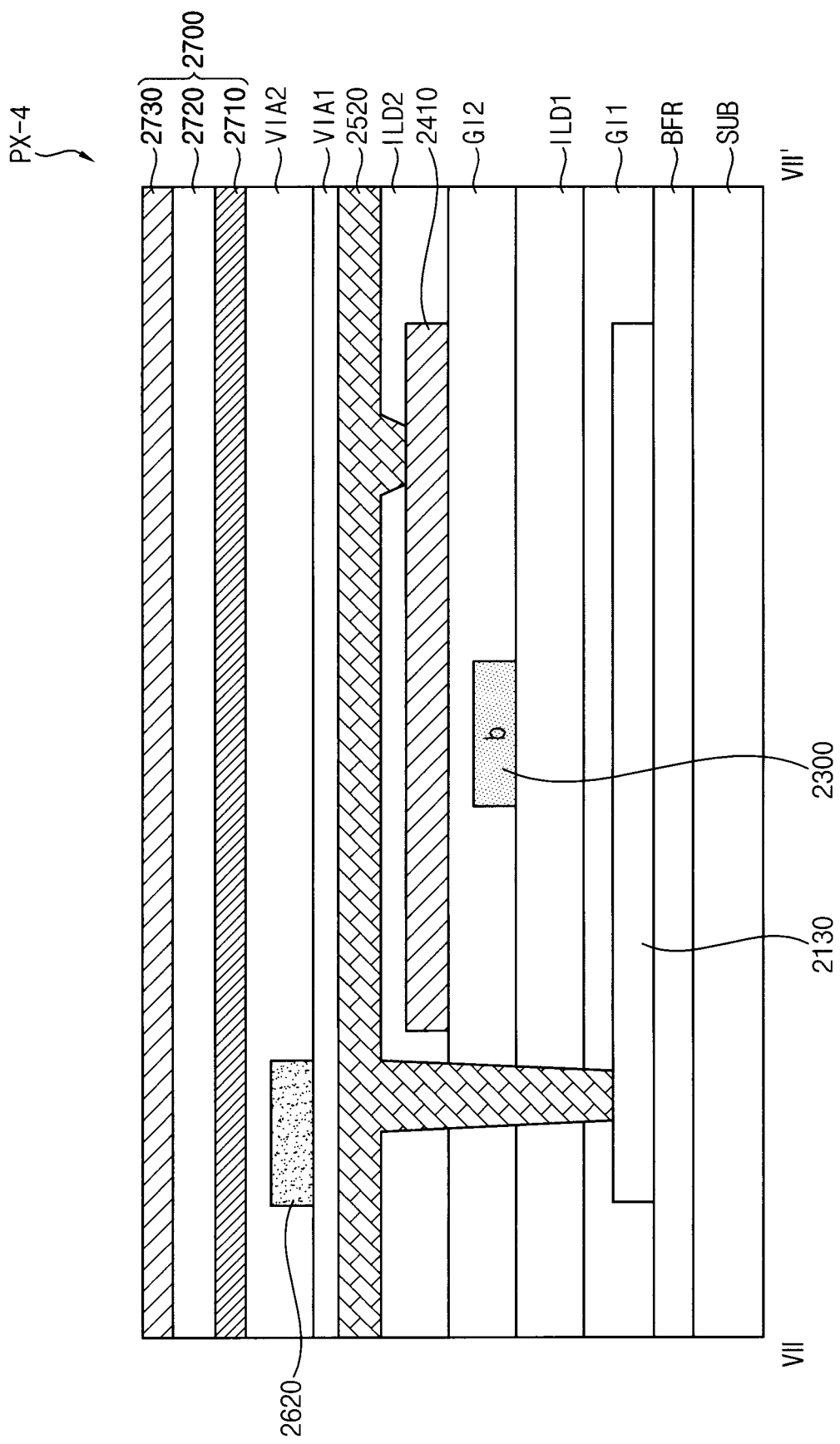
FIG. 24 is a cross-sectional view taken along the line VII-VII' of FIG. 22.

FIG. 24 is a cross-sectional view taken along the line VII-VII' of FIG. 22.

Referring to FIGS. 2, 22, and 24, the pixel structure PX may include the substrate SUB, the buffer layer BFR, the first gate insulating layer GI1, the first lower electrode 2130, the first interlayer insulating layer ILD1, the second active pattern 2300, the second gate insulating layer GI2, the first upper electrode 2410, the second interlayer insulating layer ILD2, the first signal line 2520, the first via insulation layer VIA1, the driving voltage line 2620, the second via insulating layer VIA2, the first electrode 2710, the emission layer 2720, and the second electrode 2730 are sequentially arranged.

As described above, the first signal line 2520 may contact the first lower electrode 2130 and the first upper electrode 2410. Accordingly, the third gate signal GI provided through the first signal line 2520 may be transmitted to the first lower electrode 2130 and the first upper electrode 2410.

According to some embodiments, the first upper electrode 2410 may include molybdenum ("Mo"), an alloy containing molybdenum, and the like, and the first signal line 2520 may have a Ti/Al/Ti structure including aluminum ("Al"). Accordingly, the electrical resistance of the first signal line 2520 may be smaller than the electrical resistance of the first upper electrode 2410. As the line for transmitting the third gate signal GI is implemented as the first signal line 2520, the transmission speed of the third gate signal GI may be improved, and the voltage level of the third gate signal GI may be maintained.

According to some embodiments, the second active pattern 2300, the first lower electrode 2130, and the first upper electrode 2410 may overlap each other. Accordingly, the second active pattern 2300, the first lower electrode 2130, and the first upper electrode 2410 may constitute the fourth transistor T4 having a dual-gate structure. As the fourth transistor T4 is implemented in a dual-gate structure, a turn-on characteristic and/or a turn-off characteristic of the fourth transistor T4 may be improved.

Although aspects of some example embodiments and implementations have been described herein, other embodiments and modifications will be apparent from this description. Accordingly, embodiments according to the inventive concepts are not limited to such embodiments, but rather to the broader scope of the appended claims, and their equivalents, and various obvious modifications and equivalent arrangements as would be apparent to a person of ordinary skill in the art.

What is claimed is:

1. A display device comprising:
   a substrate;

a first active pattern on the substrate;
a second active pattern on the first active pattern;
a gate insulating layer on the second active pattern;
a first upper electrode on the second active pattern and having an island shape;
a first signal line on the first upper electrode, being electrically connected to the first upper electrode, and having an electrical resistance smaller than an electrical resistance of the first upper electrode,
wherein the second active pattern comprises a material that differs from a material of the first upper electrode,
the second active pattern is covered by the gate insulating layer, and
the first upper electrode contacts an upper surface of the gate insulating layer; and
a first lower electrode between the first active pattern and the second active pattern,
wherein the first signal line is electrically connected to the first lower electrode.

2. The display device of claim 1,
wherein the first lower electrode has an island shape.

3. The display device of claim 1, wherein the first signal line contacts the first lower electrode and the first upper electrode.

4. The display device of claim 1, wherein the first lower electrode, the first upper electrode, and the second active pattern overlap each other.

5. The display device of claim 1, further comprising:
a second upper electrode on the second active pattern and having an island shape; and
a second signal line on the second upper electrode and electrically connected to the second upper electrode.

6. The display device of claim 5, further comprising:
a second lower electrode between the first active pattern and the second active pattern, and having an island shape,
wherein the second signal line is electrically connected to the second lower electrode.

7. The display device of claim 6, wherein the second signal line contacts the second lower electrode and the second upper electrode.

8. The display device of claim 6, wherein the second lower electrode, the second upper electrode, and the second active pattern overlap each other.

9. The display device of claim 5, further comprising:
a first gate electrode between the first active pattern and the second active pattern and having an island shape; and
a third signal line on the first gate electrode and being electrically connected to the first gate electrode.

10. The display device of claim 9, wherein the third signal line contacts the first gate electrode, and
wherein the first active pattern, the first gate electrode, and the third signal line overlap each other.

11. The display device of claim 9, further comprising:
a second gate electrode between the first active pattern and the second active pattern, and having an island shape; and
a fourth signal line on the second gate electrode and electrically connected to the second gate electrode.

12. The display device of claim 11, wherein the fourth signal line contacts the second gate electrode, and
wherein the first active pattern, the second gate electrode, and the fourth signal line overlap each other.

13. The display device of claim 1, wherein the first signal line contacts the first upper electrode.

14. The display device of claim 13, wherein the first upper electrode contacts the first lower electrode.

15. The display device of claim 1, wherein the first signal line contacts the first lower electrode.

16. The display device of claim 15, wherein the first lower electrode contacts the first upper electrode.

17. The display device of claim 1,
wherein the first lower electrode in a same layer as the first active pattern and having an island shape, and
wherein the first signal line is electrically connected to the first lower electrode.

18. The display device of claim 17, wherein the first signal line contacts the first lower electrode and the first upper electrode.

19. The display device of claim 1, wherein the first upper electrode and the first signal line comprise metal materials different from each other.

20. The display device of claim 1, wherein the first active pattern comprises polycrystalline silicon, and
wherein the second active pattern comprises an oxide semiconductor.

* * * * *